US008849225B1

(12) United States Patent
Sullivan

(10) Patent No.: US 8,849,225 B1
(45) Date of Patent: Sep. 30, 2014

(54) CHANNEL MONITORING WITH PLURAL FREQUENCY AGILE RECEIVERS

(75) Inventor: Terence Sean Sullivan, Somerville, MA (US)

(73) Assignee: RangeCast Technologies, LLC, Ely, NV (US)

( * ) Notice: Subject to any disclaimer, the term of this patent is extended or adjusted under 35 U.S.C. 154(b) by 245 days.

(21) Appl. No.: 13/474,191

(22) Filed: May 17, 2012

Related U.S. Application Data

(60) Provisional application No. 61/487,915, filed on May 19, 2011.

(51) Int. Cl.
*H04B 1/18* (2006.01)
*H04B 7/00* (2006.01)

(52) U.S. Cl.
USPC ............. 455/179.1; 455/161.1; 455/185.1; 455/520

(58) Field of Classification Search
CPC ....... H04H 20/22; H04H 60/17; H04H 60/43; H04H 2201/13; H04W 4/06; H04W 76/005; H04W 76/021
USPC .......... 455/161.1, 179.1, 184.1, 185.1, 186.1, 455/507, 514, 517–521
See application file for complete search history.

(56) References Cited

U.S. PATENT DOCUMENTS

| | | | |
|---|---|---|---|
| 5,020,130 A * | 5/1991 | Grube et al. ............. 455/9 |
| 6,014,687 A | 1/2000 | Watanabe et al. |
| 6,300,880 B1 * | 10/2001 | Sitnik ............. 340/4.4 |
| 6,381,314 B1 | 4/2002 | Walinski |
| 6,389,463 B2 | 5/2002 | Bolas et al. |
| 6,519,472 B1 * | 2/2003 | Brennan et al. ............. 455/518 |
| 6,581,103 B1 | 6/2003 | Dengler |
| 6,934,277 B1 | 8/2005 | Werve et al. |
| 2001/0027399 A1 | 10/2001 | Yasushi et al. |
| 2002/0091790 A1 | 7/2002 | Cubley |
| 2004/0002970 A1 | 1/2004 | Hur |
| 2004/0098341 A1 | 5/2004 | Urich et al. |
| 2005/0010961 A1 | 1/2005 | Hagan et al. |
| 2005/0013440 A1 * | 1/2005 | Akiyama et al. ............. 380/277 |
| 2005/0232282 A1 | 10/2005 | Silver et al. |
| 2006/0126494 A1 | 6/2006 | Dougall et al. |
| 2007/0143816 A1 * | 6/2007 | Gupta et al. ............. 725/135 |
| 2008/0117899 A1 | 5/2008 | Sullivan et al. |
| 2010/0281178 A1 * | 11/2010 | Sullivan ............. 709/231 |
| 2010/0303033 A1 * | 12/2010 | Shahar et al. ............. 370/329 |
| 2011/0159800 A1 * | 6/2011 | Ueoka et al. ............. 455/3.06 |
| 2012/0290532 A1 * | 11/2012 | Zigler et al. ............. 707/616 |

* cited by examiner

*Primary Examiner* — Simon Nguyen
(74) *Attorney, Agent, or Firm* — Dan Brown Law Office; Daniel R. Brown

(57) ABSTRACT

A system and method to efficiently use a plurality of 'receivers' to monitor a larger plurality of 'sources' for audio content. Upon identifying that a source is active, one of the plural receivers is assigned to convey the content to a destination. All other receivers are prevented from monitoring that specific source for the duration of its activity, but continue to monitor the remaining sources. 'Source' includes any source of information containing audio content. 'Receiver' includes any device capable of selectively conveying such content, including physical switches, hardware or software multiplexers, microphones, radio receivers, or any other means of obtaining such content.

9 Claims, 6 Drawing Sheets

CHANNEL MONITORING WITH PLURAL FREQUENCY AGILE RECEIVERS

BACKGROUND OF THE INVENTION

1. Field of the Invention

The present invention relates to scanning radio receivers. More particularly, the present invention relates to control systems for optimizing the efficiency of reception of intermittent audio content broadcast on plural channels and received by plural frequency agile receivers.

2. Description of the Related Art

Scanning radio receivers, commonly known as "police scanners" or simply "scanners", allow users to listen to police, fire, aircraft, marine, business and other manner of one-way and two-way radio communications across a broad spectrum of frequencies, typically from 25 MHz to 1300 MHz, and including higher frequencies as well. Scanners typically have a channel memory that is used to store one or more receiver frequencies, or indicia of frequency, which can be recalled by referencing a channel number, thereby simplifying the entry and selection of desired reception frequencies. Various types of scanners are known, some operating in a few bands of frequencies with limited channel memory capacity, others being full-featured models that cover all the pertinent bands and including generous channel memory capacity. Scanners are enabled to sequentially change reception frequencies, thereby scanning through a list of frequencies, searching for broadcasts that may or may not be of interest to a user. In modern scanners the selection of a radio frequency generally includes specifying the radio frequency band and the receiver phase-locked loop (PLL) divisor that is requires to tune the receiver to discriminate the precise frequency of interest. Thus, the specification of the RF-band and PLL divisor with a digital selection means enables a precise reception frequency in most scanners. Modern radio broadcast systems employ digital processor to control the allocation of frequencies for radio communications. This typically also include spectrum utilization efficiency improving techniques that enable systems to offer a greater number of communications "channels" than the number of actual radio frequencies that may exist in a system. Thus, a single frequency may be utilized for a large number of channels, which are managed by the system protocol. The system protocols use various techniques for defining and allocating channels, and modern scanners have corresponding decoding systems or distinguishing channels from one another, as is appreciated by those skilled in the art.

Scanner radio receivers typically employ some form of squelch control so that noise and undesirable communications are not routed through to a loudspeaker or other audio output. Carrier squelch can be used, which gates received audio to a loudspeaker based on the signal-to-noise ratio or carrier-to-noise ratio of the receiver demodulator output. Other systems employ out of band tones that are detected to control squelch. This is an example of a technique to provide more than one channel of communications on a single frequency. Certain receivers are sensitive to certain tones, and therefore communication that only those channels. One such system employs plural sub-audible tones, and is referred to as a continuously tone coded squelch system ("CTCSS"). The receiver checks for a particular one of the plural tones based on the channel programming, and detection of a matching tone enables the squelch gate of the receiver. Another system employs digital data fields that are broadcast along with the primary communication signals, and the receiver looks for a matching digital code. Such systems are referred to as digitally coded squelch systems ("DCS"). Other squelch control systems are known as well.

Early two-way radio systems employed a single radio frequency or a duplex pair of radio frequencies for two-way communications. Such systems lent themselves well to scanner receiver monitoring because a given two-way radio fleet of users, such as the local police department, could be readily monitored by receiving a single, predetermined, radio frequency. However, heavy radio use demand and congested airways caused manufacturers to develop more spectrally efficient radio systems. One solution was the trunked radio system where a group of two to twenty-eight duplex pairs of radio frequencies are allocated together for shared use by plural fleets of users. In a trunked system, talk group identities are assigned to the fleets, which are used to provide receiver squelch gate control for the plural members of the fleet. The difference in a trunked radio system vis-à-vis a conventional system is that the radio frequencies are dynamically allocated during use. As such, a conversation between a dispatcher and a fleet of patrol cars, for example, can change from frequency to frequency within the trunked group of frequencies during the course of a conversation. Suppliers of scanning receivers addressed this difference in functionality by developing radios that could track the talk group identities ("Talk group ID's") and dynamically hop from frequency to frequency as the conversation progressed. The key to radio scanner operation in a trunking environment is to have all of the trunking frequencies for each trunk group stored in the scanner channel memory, typically associated with a system identity ("System ID"), and then track the talk group ID code of the desired fleet, along with the dynamic allocation of the trunking frequencies. In this way, the trunked scanner functions like a conventional scanner from the user's perspective, with the "channel" actually associated with both a trunking system ID and a talk group ID instead of the conventional radio system frequency-to-channel, plus squelch code, correlation. Certain trunking systems dedicate one of their allocated frequencies as a control channel carrying relatively high speed data signals, which are monitored by receivers looking for assignment to a talk channel from time to time.

Two-way mobile radio communications systems are widely used for a variety of applications including public safety, commercial, and personal communications. Radios with transmission and receive elements, commonly known as transceivers participate in these communications. In addition, radio receivers monitor communications without participating through transmissions.

Most two-way radio communications operate according to a transmission trunked control systems. This is different from the conversation trunked system. For example, a PSTN telephone call is conversation trunked in that the communications resource is set-up and maintained for the entire duration of a conversation, even during periods of quiet between the parties to the conversation. In a transmission trunked environment, the system operates in a push-to-talk mode. In this situation, each verbal statement from each user is individually transmitted. Each statement by a party to a conversation is transmitted on a radio frequency, and a conversation usually comprises a series of separate transmissions with periods of quiet in which no radio signal occur between individual transmission signal elements. In some instances, if the gap between remarks is short, a transmitter may remain active with no gap in the carrier signal of the radio transmission between remarks. When used for conversation, the result is a radio channel with a series of separate transmissions, each with a relatively short duration, typically in the range of two to sixty seconds. Depending on the level of activity on a channel, this may generate a regular patter of activity, or there may be inactive gaps extending to hours between conversations.

For the sake of clarity, the terms 'channel', 'frequency', 'signal' and 'squelch' are used as follows. The term 'channel' refers to a discrete communications path for the transmission of certain classes of related content that may be independently identified at a radio receiver, regardless of whether this path is currently active with the presence signal or inactive without the presence of signal, such as a radio broadcast frequency, a coded squelch broadcast signal, or trunked radio system talk group ID. The term 'frequency' refers to an actual radio broadcast frequency on which a communications signal is modulated or may be modulated, such as a conventional frequency or a trunked system working channel. The term 'signal' refers to a discrete period of activity on a channel, such as a single radio transmission, or a series of closely spaced but discrete transmissions. In some cases, evident by context, 'signal' may refer to the content currently present on a broadcast frequency. The term 'squelch' refers to a test determining whether signal is present on a particular frequency; squelch is true when there is no signal, and unsquelch is true when there is signal.

In common speech there may be confusion between these terms. For instance, in conventional radio systems, there is typically a one-to-one regional correspondence between channels and locally active broadcast frequencies. This encourages a perceived equivalence between the terms, or blurring of meanings. However, the terms have different technical meanings herein.

Frequency agile receivers, commonly known as "scanners", are designed to receive signals on multiple communications channels by sequentially sampling ("scanning") predetermined channels until an active signal is detected, and holding on that channel to receive audio until the transmission or series of transmissions is complete. The scanner then resumes the scanning process to detect the next new signal. Typical scanners can scan hundreds of channels. Since any individual channel will typically have long periods of inactivity, this technology is a practical way to monitor communications on multiple channels with a single receiver, although it is typically not plausible to receive simultaneous communications on different channels with a single receiver.

When a single receiver is receiving a transmission on one channel, it is typically insensitive to any radio communications on other channels. As a limited exception to that principle, some scanners have a 'priority' feature wherein the scanner periodically retunes to a designated "priority" frequency to test for signal, at the cost of brief gaps in the reception of the present non-priority signal. This tradeoff provides for greater reliability in coverage of signals on the designated priority frequency, at the direct cost of performance in the reception completeness of all non-priority signals.

Since a single receiver can only actively receive a single signal at a time, it will miss some fraction of the total communications activity of the collective set of channels being monitored, the so called scan list. The missed fraction depends on factors such as the average fraction of time that channels are in use, and the number of such channels in the scan list. In general, continuity of reception is desirable, and missed transmissions represent a deficiency in the system performance.

It is normal for unrelated transmissions using different channels to occur at the same time. For some applications, it is advantageous to detect and receive such simultaneous radio transmissions. For example, this is important for logging systems that preserve content for archival purposes. It is also important in dispatch and newsroom environments where there is no foreknowledge about which particular transmissions will convey information of importance. A prior art solution is to operate a permanently dedicated radio receiver on each desired radio channel. For instance, when monitoring 30 channels, an array of 30 radio receivers can provide complete reception coverage. However, for large numbers of channels, operating an equal number of receivers can become prohibitively expensive in terms of both electrical equipment and physical housing requirements. Therefore, despite the theoretical appeal of this simple solution, there exists a need for a more practical solution to this radio monitoring scenario, especially when trying to receive more than a few channels.

In the special case of trunked radio systems, where the content of a larger number of logical channels is always found on a smaller number of broadcast working frequencies, and which are indexed in accordance with data transmitted on an additional control channel frequency, it is possible to operate a fixed-frequency single receiver on each operational frequency within the trunked radio system, and thereby capture all content without recourse to a separate receiver for each logical channel. For example, this is taught in U.S. Pat. No. 5,710,978 to Swift for Logging Recorder System for Trunking Radio. However, a technique built upon permanently dedicated receivers becomes impractical due to the proliferation of separate frequencies to monitor when the channels to monitor include channels not carried by a particular trunked radio system.

Note that Swift uses the term "channel" in the sense of a trunked radio system "working channel", to refer to a specific broadcast frequency irrespective of the "logical channel" content carried thereupon at a given time. This use of "channel" is distinct from reference to a "logical channel" wherein each channel by definition refers to a key value indicating that content thereupon is related, even if carried upon different broadcast frequencies.

Due to the likelihood of missing transmissions on a single receiver, some users operate multiple scanning radios in parallel. However this method has serious shortcomings that limit its practical utility for comprehensive detection and reception of active signals on multiple channels. For example, consider the situation where a single channel is included in the scan list of multiple receivers. Then, whenever there is a signal on that channel, it is entirely possible that all of the receivers will detect that signal, and remained tuned to that channel until the end of transmission. This behavior is expected whenever, at any time during the period of active signal, there is no activity on the other channels being scanned by these receivers. As long as these receivers remain stopped on that initial signal, then new signals on other channels that begin during the remainder of the first signal transmission will be missed by all of the receivers. During a period when multiple receivers are monitoring the same signal, the intended benefit of using multiple receivers for more complete reception coverage is lost. This renders ineffective the option of programming a group of scanners identically, with the scan list of all desired channels.

Reference is directed to FIG. 3, FIG. 4, and FIG. 5, which together illustrate the aforementioned problem in the prior art of scanning multiple channels with plural receivers that are all programmed to scan the same channel list. FIG. 3 illustrates exemplary signal activity on five channels that are labeled A, B, C, D, and E. Time passes through intervals labeled t1, t2, t3, t4, t5, t6, t7, and t8. Note that the signals 24 are transmission trunked and sporadic in nature. FIG. 4 illustrates a reception timing diagram of three scanning radios labeled R1, R2, and R3 that are all programmed to scan all of the channels A, B, C, D, and E illustrated in FIG. 3. As a practical matter, transmission trunked signal segments 24 range in duration from a few seconds and longer. On the other hand, the channel scan rate of modern scanning radios is a few milliseconds. Thus, for this exemplary analysis, it can be assumed that the scan rate is virtually instantaneous since there are just five channels on the scan list. Thus, what FIG. 4 demonstrates is that all five radios A, B, C, D, and E received exactly the same channel signals by reason of the sequence in which the signals appear in time. Note that the long duration signal on channel C is captures by all of the radios. Now, if the captured signals in FIG. 4 are subtracted out from the total signals 24 in FIG. 3, what remains are the un-captured singles. The un-captured signals are illustrated in FIG. 5.

While use of a priority feature arguably creates a minor exception to the foregoing general rule, the same outcome is found once the scan list includes two channels not present on other receivers. In priority mode, a receiver periodically tunes away from an active signal and tests for activity on a priority channel. It is an intrinsic disadvantage of priority mode operation that an ongoing reception must me periodically interrupted to check the priority channel. If such a signal is found, the radio will remain tuned to the priority signal. Otherwise, the receiver will resume monitoring the original signal. If a channel is included in the scan list of a single receiver, but marked as the priority channel for that receiver, then all transmissions will be captured on that channel regardless of the receiver's other activity. This is a prior art method for ensuring complete reception in the case of a limited number of channels to be scanned where the number does not exceed the number of available radio receivers. However, whenever the number of monitored channels is greater than the number of available radio receivers, as is typically the case when scanners are used, since otherwise it would be possible to have a single dedicated receiver for each channel, this approach becomes ineffective for ensuring effective coverage of the entire set of channels even if the number of active channels is typically smaller than the number of available radio receivers.

A more practical prior art approach is to divide a given scan list of channels into discrete subsets, and program each receiver with one of these subsets. For example, if monitoring 50 channels with 5 receivers, each receiver may be programmed to scan 10 of these channels, with no overlap. Avoiding any channel duplication in the multiple receivers eliminates the problem of multiple receivers locking on the same signal, which would clearly reduce the effectiveness of having multiple receivers. However, if there is simultaneous activity on two of the channels in the scan list of a any individual receiver, then one of these signals will be missed, even if one or more of the other receivers are scanning and not presently monitoring any active signals.

For many applications, it is highly desirable for reception of a channel over a period of time to maximize continuity, that is, to reduce the rate of missed transmissions to zero, or as close to zero as practical. The phenomenon of missed transmissions presents a problem for any users who wish to comprehensively monitor traffic on a significant number of channels. Such a capacity would be beneficial for many applications. A first example is archival recording or logging of radio traffic, to provide a 'black box' record of events for later analysis in the event of an incident. A second example is feeding audio into an audio distribution network, so users of the network can independently select and monitor all traffic on specific channels of interest on demand, without providing these users with the capacity or authority to reprogram or direct a receiver so it remains tuned to a channel. A third example is for use in a dynamic environment where users want to have instant access to complete coverage of multiple audio sources, without the delay or risk of error associated with altering the programming of receivers. The ability of users to perform these functions is severely hampered by the lack of a technology in the prior art for effectively utilizing a group of multiple radio receivers to dynamically receive up to the same number of simultaneous signals, regardless of the particular set of channels active at that time. Thus, it can be appreciated that such a need exists.

SUMMARY OF THE INVENTION

The need in the art is addressed by the systems and methods of the present invention. A plurality of radio receivers are configured to receive up to the same number of simultaneous channel signals, regardless of the particular set of channels active at once carrying these signals. Receiver operation is coordinated through control software dynamically and temporarily dedicating individual receivers to individual channels, with associations stored in a database accessible to the control software for each of the receivers. A newly occurring signal may be detected by any of a plurality of undedicated receivers, or assigned to an undedicated receiver upon detection. A signal on a channel is captured by a single receiver temporarily dedicated to that channel, and is further ignored by all other receivers. While dedicated to a particular channel, a receiver ignores any signals on other channels. Dynamic associations may operate as "leases" with periodic extensions if the channel remains active, where an exchange protocol between receiver control software and the database is used to grant and renew leases in a timely manner. In an alternative embodiment, associations may remain active until released at the end of a signal or series of signals. The present invention improves the signal detection and capture efficiency of group of radio receivers, when used to monitor content broadcast on a number of radio channels exceeding the number of radio receivers in the group.

The present invention teaches a system and method of simultaneously monitoring communications on a plurality of source channels with a plurality of receivers that are capable of digitally reporting current channel identification information for a currently received signal. The receivers digitally receive commands affecting source selection, wherein each of the receivers is connected to a control system including a database. The control system maintains a locking record that reserves exclusive receive rights for a source channel, which is identified by a channel identification code, to a single receiver within said plurality of receivers. During signal reception, a first receiver reports a channel identification code to the control system that identifies a first source channel currently received by that receiver. The control system determines whether there are other rights for the first source channel identified by a first channel identification code currently assigned through the locking record to another receiver. If such rights exist, then the control system sends a command to said first receiver commanding the receiver to cease reception of the current signal on the first source channel, and seek a new signal for reception. On the other hand, if such rights do not exist, then the control system updates the locking record to assign exclusive receive rights for the source channel identified by a first channel identification code to the first receiver, and authorizes reception of the signal by the first receiver for monitoring communications on the source channel for at least the duration of the present signal.

In a specific embodiment of the foregoing system and method, the step of monitoring communications further includes a selection system for selecting at least one source of interest from among the sources received by the plurality of receivers. It also includes an access system for monitoring content from the at least one source of interest, captured through whichever of the plurality of receivers receives each discrete transmission on a source of interest, and while not monitoring content from other sources not selected.

In a specific embodiment of the foregoing system and method, the source channels include radio channels, the receivers include frequency agile radio receivers, and the step of affecting a frequency agile radio receiver's source selection further includes affecting the receiver's frequency tuning operations.

In a specific embodiment of the foregoing system and method, the step of monitoring communications further includes the step of recording communications on the source channel.

In a specific embodiment of the foregoing system and method, the step of monitoring communications further includes the steps of recording communications on the source channel, storing this recording at a network accessible address, and transmitting a notification of the network accessible address together with the channel identification code.

In a specific embodiment of the foregoing system and method, the step of monitoring communications further includes generating an audio stream of content recorded from at least the first source channel as received through whichever receiver among the plurality of receivers is currently receiving content on the first source channel, and the step of distributing the audio stream of content recorded from at least the first radio channel to at least one remote monitoring location via data network.

In a specific embodiment of the foregoing system and method, the step of commanding the receiver to cease reception of the current signal and seek a new signal for reception further includes the steps of sending a command instructing the receiver to skip the present signal and resuming sampling for the presence of communications on other source channels.

In a specific embodiment of the foregoing system and method, the step of commanding the receiver to cease reception of the current signal and seek a new signal for reception further includes the steps of sending a command instructing the receiver to remove the channel of the present signal from its active scan list and resuming sampling for the presence of communications on other source channels.

In a specific embodiment of the foregoing system and method, the locking record is an access lock created when a signal is first reported by any receiver and removed after the end of signal, and receive rights are reserved to the receiver reporting the signal while the access lock was absent.

The present invention also teaches a system and method of simultaneously monitoring communications on a plurality of source channels with a plurality of receivers that are connected to a control system including a database that includes each receiver associated with a scan list of a plurality of source channels of interest, and capable of digitally receiving commands affecting source selection. The system and method functions such that each receiver, when not receiving signal, samples the source channels in the scan list to detect the presence of signal on any of the source channels. Upon detection of signal on a first source channel, a first receiver reports signal detection on the first source channel to the control system, and receives the signal for monitoring communications on the first source channel for at least the duration of the signal. The control system disables the first channel from the scan lists of each other receiver within the plurality of receivers where the channel is included in the receiver's scan list, thereby preventing other receiver from testing the first channel for the presence of signal until otherwise directed. When the first receiver detects the end of the signal, the first receiver reports end of signal to the control system, and resumes scanning for the presence of signals on the source channels in the first receiver's scan list. The control system selects at least a second receiver where the first source channel was disabled from the receiver's scan list and sends a command to the second receiver, thereby re-enabling the first source channel in the second receiver's scan list, whereupon the first and second receivers periodically test the first source channel for the presence of signal.

In a specific embodiment of the foregoing system and method, the step of monitoring communications further includes a selection system, for selecting at least one source of interest from among the sources received by the plurality of receivers, and an access system for monitoring content from the at least one source of interest captured through whichever of the plurality of receivers receives each discrete transmission on a source of interest, while not monitoring content from other sources not selected.

In a specific embodiment of the foregoing system and method, and wherein the source channels include radio channels, the receivers include frequency agile radio receivers, and wherein the step of affecting a frequency agile radio receiver's source selection further includes affecting the receiver's frequency tuning operations.

In a specific embodiment of the foregoing system and method, the step of monitoring communications further includes the step of recording communications on the source channel.

In a specific embodiment of the foregoing system and method, the step of monitoring communications further includes the steps of recording communications on the source channel, storing this recording at a network accessible address, and transmitting a notification of the network accessible address together with the channel identification code.

In a specific embodiment of the foregoing system and method, the step of monitoring communications further includes generating an audio stream of content recorded from at least the first source channel as received through whichever receiver among the plurality of receivers is currently receiving content on the first source channel, and distributing the audio stream of content recorded from at least the first radio channel to at least one remote monitoring location via data network.

In a specific embodiment of the foregoing system and method, the scan list for each receiver is maintained within the corresponding receiver, and control system actions to disable and enable channels include sending commands to affect the scan list on that receiver.

In a specific embodiment of the foregoing system and method, the scan list for each receiver is maintained within the control system, and wherein sampling for the presence of signal on a scan list of radio channels includes control system commands to a receiver to sequentially test specified channels for the presence of signal.

In a specific embodiment of the foregoing system and method, wherein after the detection of end of signal, the first receiver continues to watch for signal on the first source channel for a channel hold time beyond the end of signal before resuming scanning for the presence of signals on the source channels in the first receiver's scan list, and before the control system sends a command to the second receiver re-enabling the first source channel in the second receiver's scan list.

The present invention also teaches a system and method of simultaneously monitoring communications on a plurality of sources with intermittent signal and content using a plurality of receivers, each configured to receive content on at least a first source and a second source, and wherein the number of sources exceeds the number of receivers. A first receiver detects the presence of a first signal on the first source, and a first recording system records content of the first signal received through the first receiver together with a source identifier of the first source. A second receiver detects the presence of a second signal on the second source, overlapping the duration of the first signal, and a second recording system records content of the second signal received through the second receiver together with a source identifier of the second source. The second receiver detects the presence of a third signal on the first source that is received through the second receiver after the termination of the first signal and second signal. The second recording system records content of the third signal received through the second receiver together with a channel identifier of the first source. The system includes a selection system for selecting at least one source of interest from among the sources received by the plurality of receivers. The system also includes an access system for monitoring content from the at least one source of interest captured through any of the plurality of receivers, and that is configured to receive content on any of the at least one source of interest while not monitoring content from other sources not selected.

In a specific embodiment of the foregoing system and method, the source channels include radio channels, the receivers include frequency agile radio receivers, and the step of affecting a frequency agile radio receiver's source selection further includes affecting the receiver's frequency tuning operations.

In a specific embodiment of the foregoing system and method, wherein the first radio channel is a logical channel of a trunked radio system, and the radio receivers are configured to receive content on the first radio channel, and are monitoring the broadcast frequencies of the trunked radio system, which are temporarily assigned to various logical channels within the trunked radio system, including the first radio channel.

In a specific embodiment of the foregoing system and method, wherein the first source channel is a logical channel of a trunked radio system, and wherein a third receiver is tuned to a control channel frequency of the trunked radio system that is carrying a datastream reporting temporary associations between trunked radio system talk groups and broadcast frequencies, the method further contemplates that upon detection of a signal on the first source channel by analysis of data within the datastream, one of the plurality of receivers is tuned to the indicated broadcast frequency temporarily assigned to the first source channel to receive content on the first source channel.

In a specific embodiment of the foregoing system and method, wherein the first radio channel is a conventional radio channel on a single radio broadcast frequency, the method contemplates that upon the first receiver detecting the presence of a signal on the first radio channel, a control system prevents recording of the first radio channel for the duration of the signal by any other of the plurality of radio receivers configured to receive content on the first radio channel.

In a specific embodiment of the foregoing system and method, a spectral analysis means generates a list of radio frequencies in the electromagnetic spectrum with active signal, and upon detection of a new signal through the spectral analysis means, a command system directs a frequency agile receiver not currently receiving signal to tune to the frequency of the new signal and receive content carried on the new signal for monitoring.

In a specific embodiment of the foregoing system and method, the access system further includes storing this recording at a network accessible address and distributing a notification of the network accessible address together with the channel identifier.

In a specific embodiment of the foregoing system and method, the access system further includes generating an audio stream of content recorded from at least the first source channel as received through whichever receiver among the plurality of receivers is currently receiving content on the first source channel, and distributing the audio stream of content recorded from at least the first radio channel to at least one remote monitoring location via data network.

In a specific embodiment of the foregoing system and method, wherein a control system is in communication with each of the plurality of radio receivers, the control system maintains a locking record created when a signal is detected, and is removed after the end of signal, thus reserving exclusive receive rights for a source channel identified by a channel identification code to a single receiver within the plurality of receivers.

DESCRIPTION OF THE INVENTION

Figure 1:
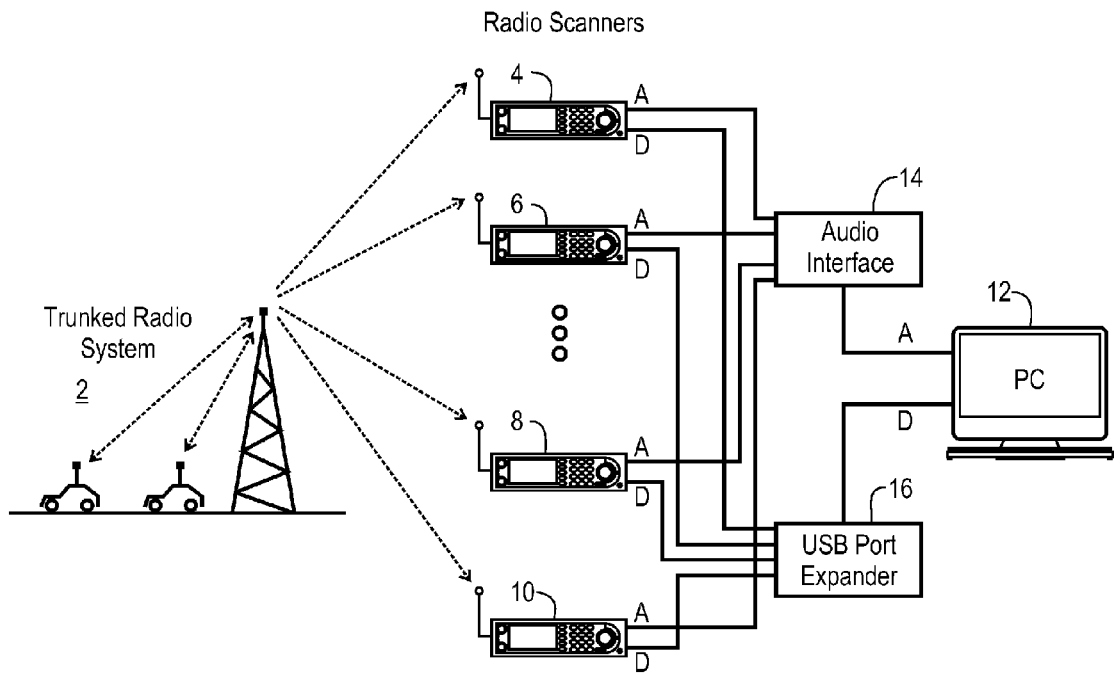
FIG. 1 is a system diagram of plural receivers monitoring a radio system according to an illustrative embodiment of the present invention.

Illustrative embodiments and exemplary applications will now be described with reference to the accompanying drawings to disclose the advantageous teachings of the present invention.

While the present invention is described herein with reference to illustrative embodiments for particular applications, it should be understood that the invention is not limited thereto. Those having ordinary skill in the art and access to the teachings provided herein will recognize additional modifications, applications, and embodiments within the scope hereof and additional fields in which the present invention would be of significant utility.

In considering the detailed embodiments of the present invention, it will be observed that the present invention resides primarily in combinations of steps to accomplish various methods or components to form various apparatus and systems. Accordingly, the apparatus and system components and method steps have been represented where appropriate by conventional symbols in the drawings, showing only those specific details that are pertinent to understanding the present invention so as not to obscure the disclosure with details that will be readily apparent to those of ordinary skill in the art having the benefit of the disclosures contained herein.

In this disclosure, relational terms such as first and second, top and bottom, upper and lower, distal and proximal, and the like may be used solely to distinguish one entity or action from another entity or action without necessarily requiring or implying any actual such relationship or order between such entities or actions. The terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. An element proceeded by "comprises a" does not, without more constraints, preclude the existence of additional identical elements in the process, method, article, or apparatus that comprises the element.

It is noteworthy to discuss what a "channel" is and how that term is used in the present invention. Channel is used herein to refer to a logical channel, in a broad sense of the term encompassing both trunked talk groups and conventional radio channels. It is also noteworthy to discuss the use of the term "lease" with respect to the present invention. As the legal terminology suggests, it is the temporary assignment of limited rights in something, which has a beginning time and an end time, both of which occur based on some predetermined conditions. This specification spends an amount of time talking about lease periods.

An illustrative embodiment of the present invention is comprised of several functional elements. These include a plurality of frequency agile radio receivers, which may be four Uniden model BCT-996XT scanners, available from Scanner Master Corporation in Holliston MA. Each radio receiver has an associated antenna for receiving signals from the electromagnetic environment. Another element is a standard personal computer, with four running instances of a receiver control software package, which can be written in Liberty Basic, and one running instance of a server application, which can be written in the PHP language, known to those skilled in the art. The server manages a lease database associating receivers, signals, and expiration times. Each instance of receiver control software maintains a cache of the last known lease database. Additionally, two cables between the computer and each radio receiver, including one data cable and one audio cable, where the audio cables are interfaced to the computer through exterior USB sound cards. Supplementary USB hubs may be required to provide a sufficient number of USB inputs to the computer.

Reference is directed to FIG. 1, which is a system diagram of plural receivers monitoring a radio system according to an illustrative embodiment of the present invention. I this embodiment, a trunked radio system 2 is being monitored. Although, in other embodiments, multiple trunk systems and multiple conventional radio systems may be monitored. Plural radio scanner 4, 6, 8, 10 are positioned with RF circuits to intercept the radio broadcasts from the trunked radio system 2.

Figure 2:
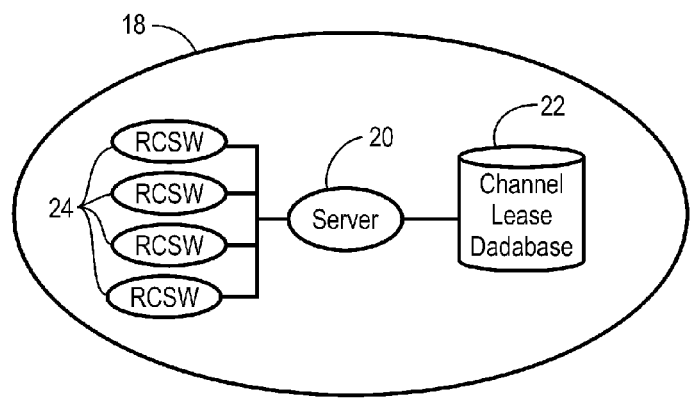
FIG. 2 is a processing environment diagram according to an illustrative embodiment of the present invention.

Each of the radio scanners have analog audio out puts and data interfaces that are coupled to a audio interface 14 and a USB port data interface 16, respectively. Such interfaces are know to those skilled in the art. The interfaces 14, 16 are coupled, in turn, to a computing device 12. Reference is further directed to FIG. 2, which is a processing environment 18 diagram according to an illustrative embodiment of the present invention. A server 20 is interface to plural instances 24 of a receiver control software package, which interfaces to the plural scanning radios in this illustrative embodiment. A channel lease database 22 is interface to the server 20 and provides a data store of channel lease and other operational parameters.

A theory of operation in an illustrative embodiment comprises a plurality of receivers that are used to monitor audio content from a larger plurality of sources with intermittent audio content. Upon identifying that a particular source is active, one of the plural receivers is assigned to convey the content to a destination, which is typically an analog speaker, a digital data file, or a network stream. Within this array of receivers, all other receivers are prevented from monitoring that specific source for the duration of its activity. This is typically a single discrete period of signal, although it may include a series of closely spaced discrete communications. During this time, these other receivers continue to monitor content that may appear from other sources.

In this context, "source" includes any source of information containing audio content, obtained physically (e.g. an analog input), electronically (e.g. a network stream), or logically (e.g. a trunked radio talk group with individual signal elements that are temporarily assigned to different radio frequencies). "Receiver" includes any device capable of selectively conveying such content, including physical switches, hardware or software multiplexers, microphones, radio receivers, or any other means known to those skilled in the art for obtaining such content. In a typical implementation, the sources are radio channels such as conventional and trunked talk groups, while the receivers are frequency agile radio scanners.

In an illustrative embodiment of the present invention, the operation of multiple radio receivers is coordinated through control software dynamically dedicating individual receivers to individual channels. These dynamic associations are stored in a database accessible to control software for each of the scanners. For at least some channels, multiple undedicated receivers are configured to detect new signals.

When a new signal on a channel is first detected, a single receiver is temporarily and exclusively dedicated to that channel. The receiver dedicated is usually the receiver making the discovery of new signal, however in some embodiments and circumstances, another receiver may be assigned the responsibility of reception while the discovery receiver continues sweeping to detect new signals.

A signal on a channel is only received by the single receiver that is currently dedicated to that channel, and such a dedicated receiver ignores any signals on other channels. Dynamic associations may operate as leases with periodic extensions if the channel remains active, where an exchange protocol between receiver control software and the database is used to grant and renew leases in a timely manner. In an alternative embodiment, associations may remain active until released after the end of a signal or series of signals.

In an illustrative implementation, the receivers are all programmed to scan the same set of channels, so that any channel may be received by any receiver, and signal on any channel will be detected unless all receivers are simultaneously dedicated to activity on other channels, which is a saturation point representing maximum utilization of the available radio receivers. In such a configuration, multiple radio receivers can receive up to the same number of simultaneous signals, regardless of the particular set of channels active at once.

However, the scan lists may be varied between receivers for several reasons. If receivers differ in their capacity to receive some channels, for example due to frequency response and bandwidth limitations, antenna configurations, or signal processing capabilities for relatively exotic radio communications systems, then some channels may only be receivable through particular receivers. If some channels are deemed to have a higher relative priority than other channels, the higher priority channels may be included in the scan list of more radio receivers than the lower priority channels, or particular radio receivers with relatively short scan lists or efficient scanning performance. In such alternative configurations, it is possible for an undetected channel included in the scan list of at least one receiver, but not all receivers, to be active while a free receiver exists that does not include this channel in its scan list.

The available options for receiver control depends upon the data control interface for the particular receivers employed.

To avoid duplicate reception of a single signal by multiple receivers scanning the same set of channels, a control system prevents a second scanner from detecting a signal presently being received by another of the set of receivers, for example, by proactive alteration of the second scanner's scan list to omit the channel, or a control system can responsively force a second scanner away from a signal presently being received by another of the set of receivers after detection by the second scanner. The first method is theoretically preferred if the scanner control system supports prompt alteration of scan lists, but in practice the second method is preferred for currently available scanners due to design limitations of current commercially available scanning receivers.

Since related signals on a single channel often come in a closely spaced series, and for simplicity in control system knowledge of which receivers are currently dedicated to which channels, it is effective to command a dedicated receiver to "hold" (i.e., not cease monitoring for the presence of signal, even when no signal is present) on the channel to which it is dedicated for a limited time, and during this interval, to lock out this channel from the scan lists of all other receivers. However, if the receiver control interface does not support a fast command sequence certain to have the desired effect, less efficient methods are employed. For example, a receiver's scan operation may be left entirely undisturbed, such as by never holding or locking out any channels, by having the control system command the receiver to 'skip' past any undesired signal that the receiver may encounter during its scanning operations.

A variety of command processes leading to the desired effect are contemplated within the scope of the present invention, apparent to a person of ordinary skill in the art who is equipped with the control specification for a particular receiver and the teachings herein.

With respect to the radio receiver elements of the illustrative system, each receiver scans for active radio signals, within a scope determined by its programming (e.g. scan list, search range, etc). When a signal is detected, the receiver holds on the active channel until the transmission is complete. End of transmission in conventional radio systems is usually indicated by cessation of the carrier signal or cessation of the coded squelch tone or data. These is typically detected using a squelch test.

The receivers employ several methods of scanning, which are known in the art, and in the illustrative embodiment, particular methods are selected that are appropriate for the types of radio systems and signals to be monitored.

In conventional scanning, the receiver sequentially tunes through a series of preselected radio frequencies, conducting a squelch test on each frequency to determine the presence or absence of a signal. This may be followed with secondary criteria, such as a PL tone or data signal, broadcast with a signal and used to differentiate between multiple users of a single frequency.

In trunked system scanning, the receiver monitors a data stream on a control channel reporting associations between active logical channels, commonly referred to as "talk groups", and broadcast frequencies, commonly referred to as "working channels", with the receiver retuning to an indicated working channel to monitor signals on a logical channel of interest. The conventional and trunked scanning methods may be combined with a receiver scanning conventional channels alternately with sampling a control channel data stream to evaluate for the presence of signals on logical channels of interest.

Upon detection of a signal, the radio receiver remains tuned to the frequency carrying the signal, and demodulates audio content carried on the radio signal, producing an audio output. This is typically an analog voltage on an audio output line, but the output may also be a digital representation of the audio levels. The audio output is commonly amplified and connected to a speaker for real time monitoring. However, the audio output may also or alternatively be digitized and stored for later review, or distributed for review at remote locations. Digital processing may take place within the receiver unit, or in an external device such as a computer where the receiver audio output is presented on an audio input line to the computer unit.

With regard to scanning and searching in an illustrative embodiment of the present invention, a plurality of radio receivers are operated in a manner that supports reception of simultaneous radio communications on any of a number of radio channels that exceeds the actual number of radio receivers. The system cannot simultaneously receive signals on more channels than there are receivers, but up to that limit, the system will detect and monitor new transmissions without prior knowledge about which specific channels will be active at any time.

When monitoring a number of radio channels equal or less than the number of radio receivers, it is straight forward to dedicate a single radio receiver to each radio channel of interest. However, if the number of channels to monitor exceeds the number of receivers, such an approach is clearly inadequate. In that case, it is necessary to operate individual radios so that they will detect new signals on any of a plurality of radio channels, employing the scanning or searching function of the receiver, and upon the detection of signal, cease scan or search operations and hold on the particular channel with the new signal while receiving content.

With a single radio receiver, the scanning function is performed by the class of commercial product known as radio scanners. In such a scanner, the scan mode refers to a signal detection state where the scanner is programmed with a scan list of particular frequencies or trunked talk groups to monitor for new transmissions. The search mode refers to a signal detection state where the scanner is programmed with a range of frequencies to sweep for new signals, or a trunked radio system to monitor for new transmissions without filtering based on the complete talk group identification code.

Naturally, the performance limit of a single radio receiver is receiving a single radio signal, and existing radio scanner technology does not support efficient simultaneous reception of multiple signals by multiple receivers. One approach is to partition the scan list of desired channels into separate and non-overlapping sets assigned to each available receiver. For example, when monitoring radio channels A, B, C, D and E, a person with two radio receivers may configure Radio 1 to scan radio channels A, B and C, and configure Radio 2 to scan radio channels D an E. However, if radio channels D and E are simultaneously active, this receiver array would fail to simultaneously monitor the content of both signals. This is an example of the class of problem that is surmounted by application of the present invention.

Figure 3:
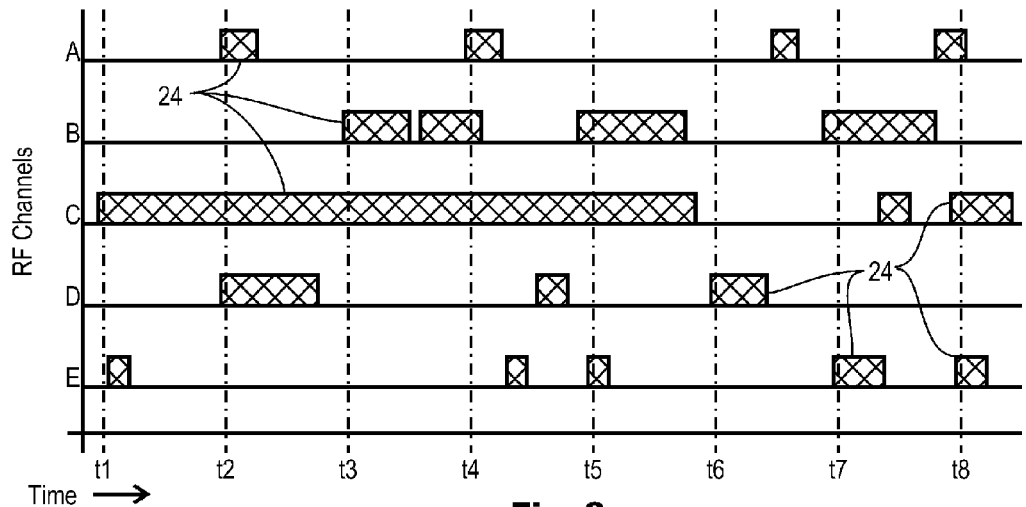
FIG. 3 illustrates exemplary signal activity on plural radio channels.
Figure 4:
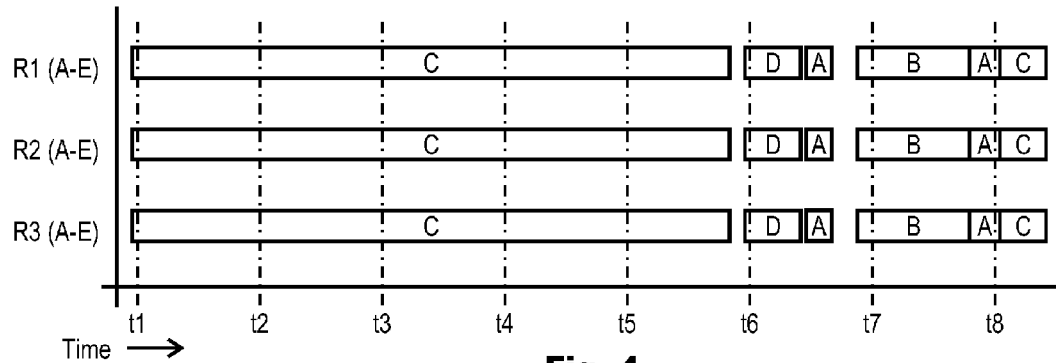
FIG. 4 is a signal capture diagram using a common scan list with respect to FIG. 3.
Figure 5:
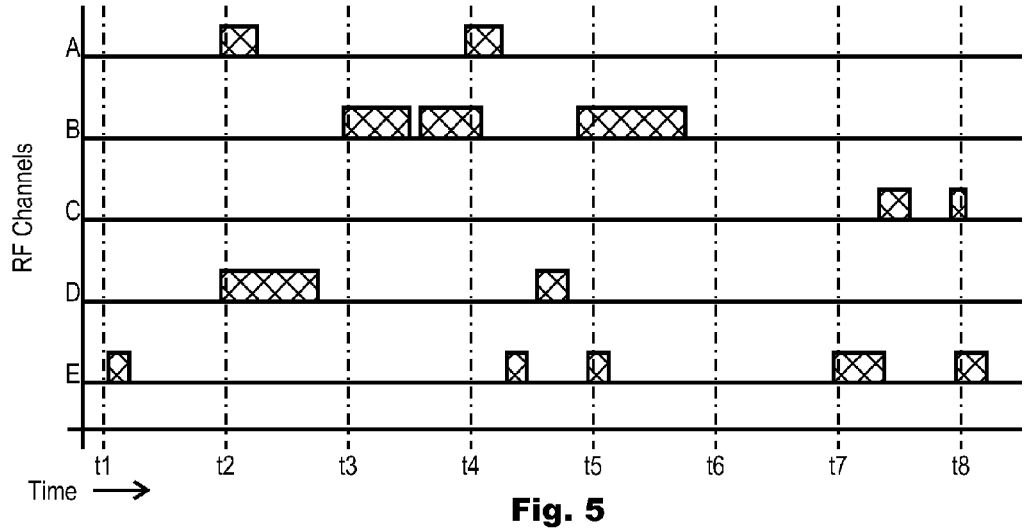
FIG. 5 is an un-captured signal diagram with respect to FIG. 3 and FIG. 4.
Figure 6:
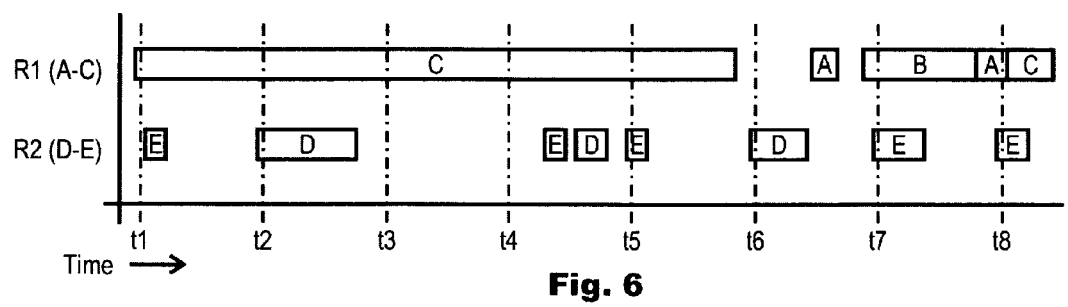
FIG. 6 is a signal capture diagram using a partitioned scan list with respect to FIG. 3.
Figure 7:
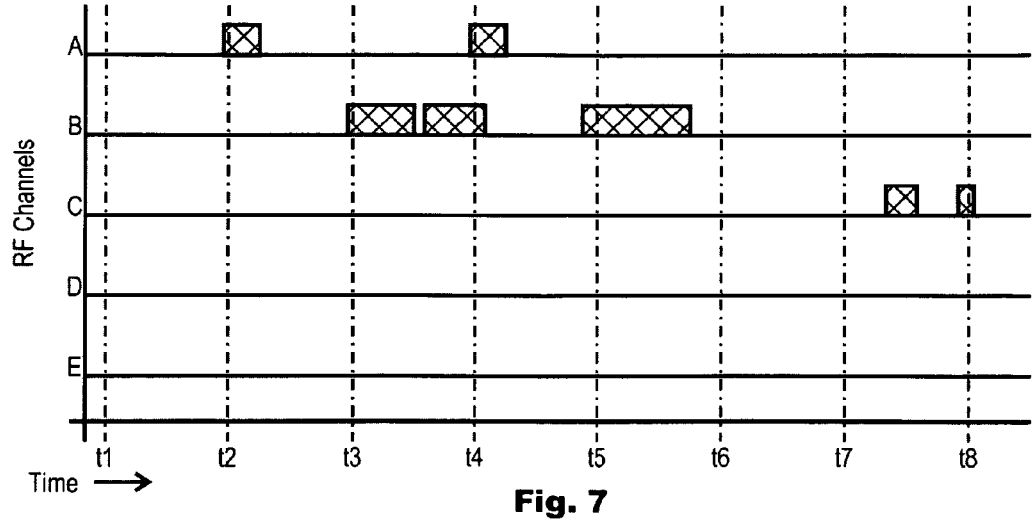
FIG. 7 is an un-captured signal diagram with respect to FIG. 3 and FIG. 6.

Reference is directed to FIGS. 3, 6, and 7, which demonstrate reception performance when a partitioned scan list is employed. Note that FIG. 3 is reproduced on the drawing sheet with FIG. 6 and FIG. 7 for convenience of the reader. Again, FIG. 3 illustrates exemplary signal activity on five channels that are labeled A, B, C, D, and E. Time passes through intervals labeled t1, t2, t3, t4, t5, t6, t7, and t8. Note that the signals 24 are transmission trunked and sporadic in nature. FIG. 4 illustrates reception timing for two scanning radios, R1 and R2. Radio R1 is programmed to received channels A, B, and C. Radio R2 is programmed to receive channels D and E. Note that Radio R1 captures the long duration signal on channel C, but that this does not prevent radio R2 from scanning and receiving channels E and F. Now, if the captured signals in FIG. 6 are subtracted out from the total signals 24 in FIG. 3, what remains are the un-captured singles. The un-captured signals are illustrated in FIG. 7. While there are still a significant number of un-captured signals, the performance with a partitioned scan list is superior to what is illustrated in FIG. 4 and FIG. 5, which was discussed on the Background section of this invention.

In an exemplary scan mode of conventional radio frequencies, the radio scanner includes a control element that commands the radio tuner to a series of frequencies, and at each frequency, a squelch test is applied to determine whether signal is present. In the case of a trunked radio system, and a scan mode on a trunked radio system, the radio scanner samples the control channel to detect digital signals reporting the existence of voice-carrying signal on a specific talk group, also referred to as a logical radio channel, and broadcast frequency, and the scanner's control element detects the signal report and commands the radio tuner to the particular frequency where the transmission is reported to currently exist. In either case, the scanner's control element features a selecting or filtering method for identifying radio channels of interest, and means for commanding the radio receiver to receive a detected signal for the duration of the transmission.

With regards to the control system architecture in an illustrative embodiment of the present invention, a plurality of frequency agile scanning radio receivers are operated in a coordinated manner, for detecting and receiving radio signals without foreknowledge about which specific channels will be active at what times. Beneficially, this can include coordination at the control layer, deciding which receivers will tune to which radio frequencies for the purpose of detecting and/or monitoring signals.

In the abstract, identification and selection of a superior method for implementing an illustrative embodiment of the present invention depends on technological development resources. As a practical matter, it is easiest to use existing commercial products, including radio scanners, that have been developed for use without design considerations supporting optimized operation of the present invention. In this case, each radio scanner operates in an essentially freestanding manner for detecting new radio signals, and each radio scanner is connected to a common control system responsible for coordinating the actions of the radio receivers through use of a data command interface. On the other hand, if the system design scope includes the construction of radio receivers, then it is preferred to implement a common control system governing the tuning operations of all receivers in the receiver group, to support rapid alteration of the effective scan lists of each receiver in response to information about the particular signals being currently received by another receiver in the group.

The following discussion addresses each of these scenarios. In general, when an external control system interfaces with each freestanding receiver's own local control system, it may be most efficient to prevent duplicate reception by not altering the scan list, allowing a receiver to detect signals it should not receive, and forcing the receiver to skip such signals after detection. When a unified radio control system directly governs all tuning operations, including sequential retuning and squelch detection steps in a scan mode, then it may be most efficient to alter the scan list, so that a receiver does not test for the presence of signals that it should not receive.

For illustrative purposes, several architectures are presented describing ways in which command responsibility is divided and partitioned through the array of coordinated radio receivers.

With regards to a unified radio control system in a first architecture, a single control element directly manages each of the radio receivers, including direct control of tuning elements and implementation of scan functions. In this case, the control element can maintain a single scan list, and use that list to direct the scanning operations of each receiver.

Figure 8:
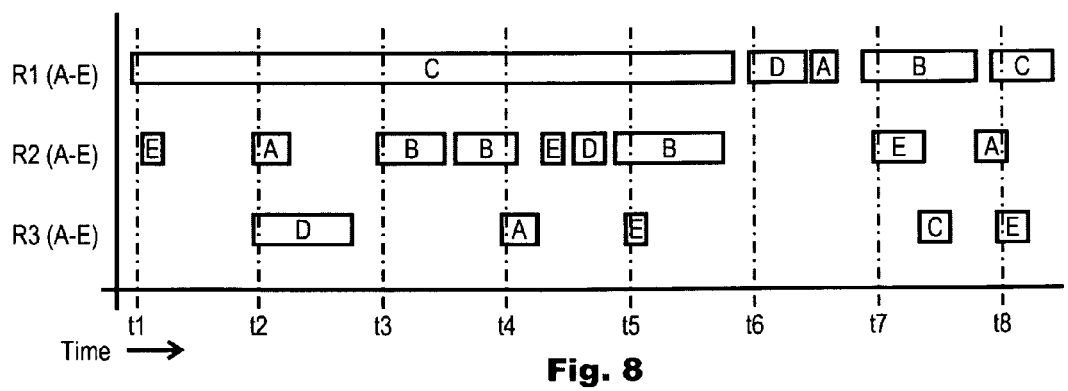
FIG. 8 is a signal capture diagram using a shared scan list with respect to FIG. 3, and according to an illustrative embodiment of the present invention.
Figure 9:
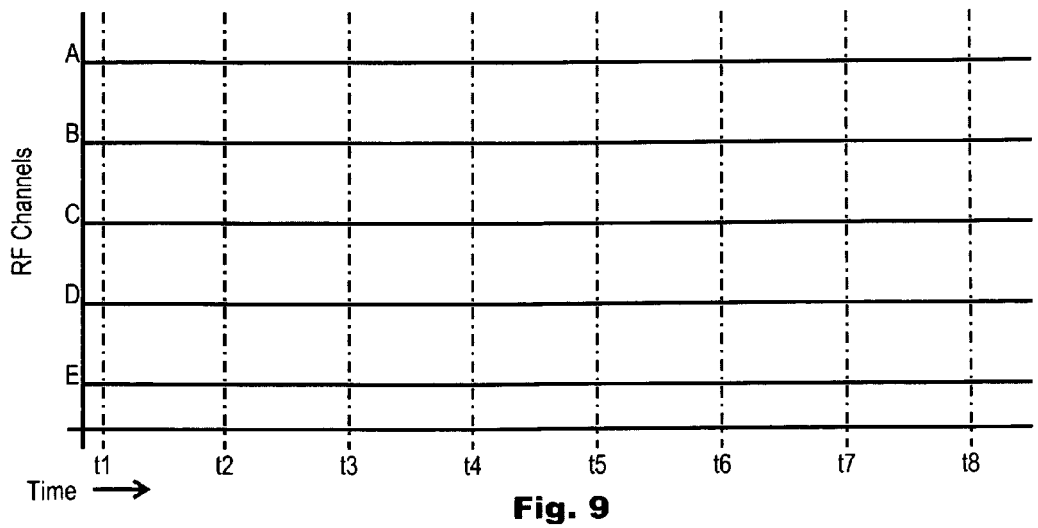
FIG. 9 is an un-captured signal diagram with respect to FIG. 3 and FIG. 8, and according to an illustrative embodiment of the present invention.

Reference is directed to FIGS. 3, 8, and 9, which demonstrate reception performance when a unified scan list is employed. Note that FIG. 3 is reproduced on the drawing sheet with FIG. 8 and FIG. 9 for convenience of the reader. Again, FIG. 3 illustrates exemplary signal activity on five channels that are labeled A, B, C, D, and E. Time passes through intervals labeled t1, t2, t3, t4, t5, t6, t7, and t8. Note that the signals 24 are transmission trunked and sporadic in nature. FIG. 8 illustrates reception timing for three scanning radios, R1, R2, and R3. The control unit is programmed with a unified scan list and directs the radios R1, R2, and R3 to avoid scanning and capture of any signal that is already being received and captured by another of these radios. Thus, any radio that is in the scanning mode of operation will not scan and receive a signal already being received. This enables the most efficient utilization of the radios for capture on the maximum number of signals, which is the simultaneous capture of three independent signals. Now, if the captured signals in FIG. 8 are subtracted out from the total signals 24 in FIG. 3, what remains are the un-captured singles. The un-captured signals are illustrated in FIG. 9. Note that there are no un-captured signals. Contrast this with result sin FIG. 7 and FIG. 5, and the reader will quickly appreciate on of the advantages of the present invention.

With regard to detection of signals on conventional frequencies using a scan operation, the control element sequentially selects frequencies from the scan list that are not presently monitored, and directs a free, squelched, scanner to tune to this next frequency to test for the presence of signal. Various optimization methods are evident for choosing a next frequency to test, taking into account the priority level and time since last sampling of the frequencies, and whether the frequency falls in the same band as a free receiver's current filter selections, particularly since switching bandpass filters introduces additional delay. When signal is detected, the control element asserts a locking record reserving exclusive receive rights for this radio channel, and the receiver remains tuned to the channel for the reception of signal. During the transmission, the locking record prevents the control system from commanding other receivers under its control to that channel. At the end of transmission, or a short time thereafter, the locking record is removed and the receiver that was receiving this signal is free to resume scanning operations.

Note that an individual receiver may be deemed free and available for resuming scanning operations when squelched, however the free condition may be suspended for a short time after end of signal, so that responses to a first transmission are promptly and reliably detected. This channel hold delay is typically under ten seconds.

For detecting signals on a trunked radio system, a single receiver is maintained on the control channel. The control system detects new transmissions on working frequencies, and dynamically assigns free receiver elements to tune to a newly active working channel, and then monitor for the duration of the active signal. In this case, the locking record may correspond to either the broadcast frequency of the working channel, or the identification code for the logical channel active on the working channel.

If the number of radio receivers equals or exceeds the number of frequencies in a trunked radio system, including control channel frequency plus working frequencies, an optimal configuration would assign a single receiver to each of these frequencies without need for scanning or retuning, so the receivers need not be frequency agile. Decoding of digital data from the control channel receiver would then provide associative information identifying the logical channel of each transmission monitored by a working channel receiver. This particular scenario may be called detrunking, since it effectively reverses the trunking process, as trunking compresses a large number of logical channels onto a small number of broadcast working channel frequencies, while detrunking expands all traffic on these broadcast working channel frequencies into discrete audio channels labeled with logical channel identifications. In some instances, depending on the data format of the trunked radio system, it may be possible to extract logical channel identifier information from data transmitted on the audio working channel, such as through sub-audible tones, in lieu of monitoring a control channel.

Note, however, that unlike prior art detrunking systems, the present invention is functional even if there are fewer radio receivers than exist broadcast working channel frequencies within the trunked radio system. In this case, new signals are detected with channel identification information received on the control channel, or by subcarrier on the working frequency, in accordance with the trunked radio system data specification. This illustrative embodiment of the present invention approaches the quality standards of traditional detrunking methods, which dedicate a receiver to each broadcast frequency, with less receiver equipment.

A group of receivers may be configured to simultaneously monitor trunked and conventional radio channels. For instance, this may be done by assigning one receiver to the trunking control channel to detect trunked radio transmissions, while at the same time using other receivers to sequentially test for the presence of signal on conventional radio channels. When signals are detected, the control system would ensure that a radio monitors the frequency with the signal, unless there are no free receivers available at that time. Similarly, any number of trunked radio systems and conventional channels may be simultaneously scanned or searched, by the construction of an appropriate scan list and sequential allocation of signal detection resources.

With regard to illustrative embodiments of the present invention that employ currently existing scanning receiver products, the scan and search control elements are integral to the internal electrical systems of the product, effectively preventing the common direct tuning control of multiple radio scanners by a single unified control system as described above. Many radio scanners include a digital communications interface that may be used to program and modify scan lists, read squelch or unsquelch settings, determine the current tuning of the receiver, and read textual information describing a logical channel being received or tested for signal. But in general, the available programming interfaces do not allow for control operations (e.g. directly requesting a retune to each new frequency to test for the presence of signal) at the speed required for maximum efficiency in using the receiver to test for the presence of signal on a large number of frequencies in a scan list. A microprocessor within the radio scanner is better positioned for the high-speed operations that would be required.

Without the development of enhanced radio scanner control systems designed in light of the present invention, this communications bottleneck sharply reduces the viability and utility of multiple radio scanners when fully controlled by a common control system. While it is clearly possible to design a common control system connected to multiple receivers with appropriate high-speed communications circuitry and embedded software designed for the coordinated operation of multiple receivers, there is an immediate benefit in the use of existing commercial products to implement the present invention, and in practice this calls for the application of alternative architectures described below.

In special cases where tuning is not required, such as the detrunking scenario described above, it may be practical to use existing radio scanners, or even dedicated single-channel receivers without frequency agility. This is, however, the exception and not always applicable.

With regards to external radio control system, and as a practical matter, it is easiest to use existing commercial radio scanners, where each radio scanner operates in an essentially freestanding manner for detecting new radio signals, and each radio scanner is connected to a common control system that is external to all the radio receivers, and that is responsible for coordinating the actions of the radio receivers through use of a data command interface.

For example, multiple radio receivers may be connected through data cables to a standard desktop, laptop or netbook personal computer, operating software to implement a control system, while still allowing the process of detecting new signals to operate under the native scan operations provided by the local control of each radio scanner's microcontroller. In effect, this divides the implementation of the overall control system for the present invention into separate pieces, with divisions based upon the convenience of using off-the-shelf components.

In relation to the internal architecture described previously, it was noted that direct control of the tuning of each receiver through the data interface is generally too slow for efficient operation. Therefore, when contemplating external control in this architecture, the scanner is allowed to use its native scanning operations under local control that is supervised by the external control system overseeing all receivers.

More generally, even amending the scan list of a radio receiver is similarly burdened by speed limitations. For example, if a particular receiver detects a signal on channel 157.400, the data communications time required to interrupt each other receiver and command the temporary omission of channel 157.400 from their active scan lists may disrupt those scanners' normal operations to an unacceptable degree, such as causing missed reception of signals on other channels during the reprogramming interval. Some efficiency may be gained through programming approaches customized to the specific commercial product, such as placing each channel under the authority of a separate quick key, which is a set of channels preprogrammed into the radio scanner with an associated quick key code, so they can be temporarily added or removed from a scan list with a relatively short command sequence. But, even this is usually not fast enough for efficient operations. On many radio communications systems, the average duration of a signal is typically only a few seconds, so the condition motivating reprogramming another scanner receiving channel 157.400 may terminate so quickly that the fixed time overhead of a reprogramming operation may consume an unacceptable fraction of the interval during which the alteration is desired. This calls for the development of an alternative method for forcing coordinated scanners to detect signals on separate channels.

If multiple radio scanners are programmed with overlapping scan lists, where at least some channels are included in the scan list of two or more scanners, and each radio scanner is allowed to freely sweep through its scan list to detect signals, without scan list amendment during normal operations in the interest of speed, then it is evident that a radio scanner will periodically detect signals that are being presently received by another receiver in the array of plural radio receivers. This is the condition that should be avoided for the correct operation of a coordinated array of radio scanners detecting and monitoring signals on a larger number of radio channels.

As corrective action, the external control system in this illustrative embodiment commands the second radio receiver to detect a signal to simply skip the current transmission and leave the currently tuned channel, and resume scanning operations to detect other new signals. In some commercially available radio scanners, such as the Uniden BCT-996XT, a simple skip command that affects receiver tuning can be sent over a digital control channel more rapidly than a command affecting the scanner's scan lists to prevent reception of the same signal. This makes a skip command more efficient for tactical reassignment of radio receivers away from signals being presently received on another receiver. In effect, subsequent receivers are waived off from receptions that are already being received. By waiving off additional receivers that land on channels already being received elsewhere, the performance capacity of these additional receivers to simultaneously detect and receive other signals is efficiently utilized by the collective system including a plurality of frequency agile radio receivers.

To implement this wave-off functionality, the control system maintains a database providing locking functions reserving exclusive receive rights for a radio channel, identified by a channel identification code, to a single receiver within said plurality of frequency agile radio receivers.

Figure 10:
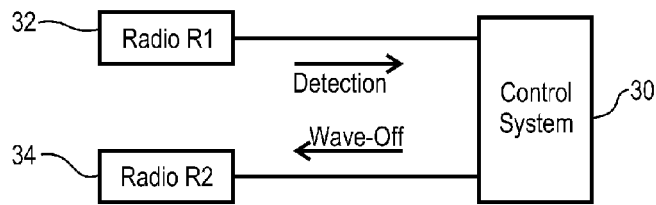
FIG. 10 is a functional block diagram of a radio and control system according to an illustrative embodiment of the present invention.
Figure 11:
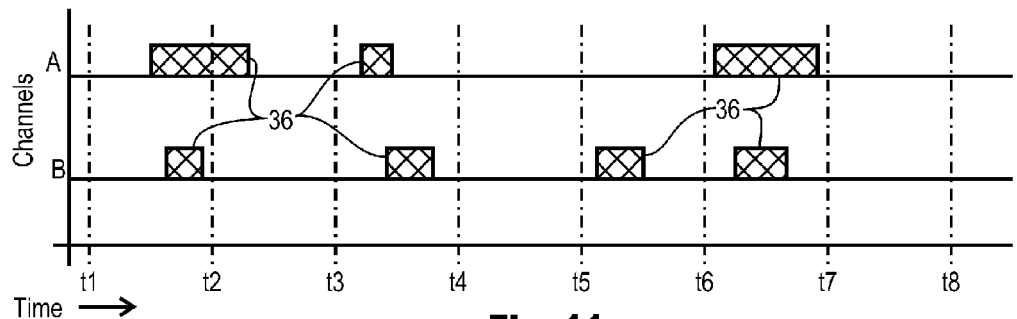
FIG. 11 is a signal transmission diagram according to an illustrative embodiment of the present invention.
Figure 12:
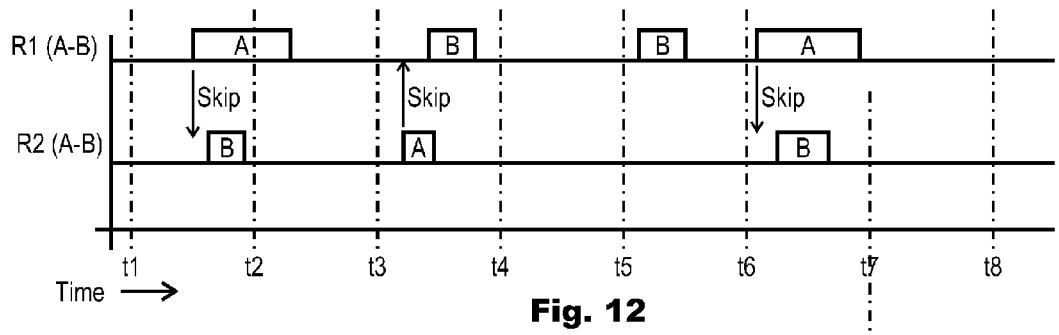
FIG. 12 is a captured signal diagram with respect to FIG. 11, and according to an illustrative embodiment of the present invention.

Reference is directed to FIG. 10, which is a functional block diagram of a system for implementing the wave-off feature using the skip command in an illustrative embodiment of the present invention. The system comprises a first radio R1 32 and a second radio R2 34. The radios are interfaced to a control system 30. As the radios detect a signal on a channel, they report the event to the control system 30. In response, the control system 30 issues a wave-off command to the other radio, in the form of a skip command. Reference is now directed to FIG. 11, which illustrates exemplary signal activity on two channels that are labeled A and B. Time passes through intervals labeled t1, t2, t3, t4, t5, t6, t7, and t8. Note that the signals 36 are transmission trunked and sporadic in nature. Reference is now directed to FIG. 12, which illustrates reception timing for two scanning radios, R1 and R2 that are both monitoring the signals of FIG. 11. Thus both radios R1 and R2 are enabled to scan, detect, and receive all the signals. However, as each radio detects a signal, it informs the control system and the control system immediately issues a skip command to the other radio, thereby causing the radio to wave-off the signal and detect whatever other signal might occur. The timing of the pertinent skip commands and the resultant scan and detect actions are also illustrated in FIG. 12.

When a receiver detects signal on a radio channel, the control system determines the identity of the channel being received. The channel identification code employed in this process may be a broadcast frequency, trunked radio logical channel number, text descriptive tag for the channel, or similar information. The control system may determine the channel being received through a query to the receiver's microcontroller, or the receiver may push this information to the control system upon the detection of signal, depending on receiver design. Once a signal is detected, the control system attempts to acquire an exclusive lock on the channel identifier.

For instance, the locking database may be implemented as an associative array, with the channel identification code as the array key element, and a locking state marked by a Boolean as the associated value, or the mere presence of a valid key. In this scenario, the array key is tested when a receiver detects a signal to see if a lock presently exists on that channel. If so, a skip command is sent to that receiver, and any partial reception from that receiver is discarded. If not, a lock is entered, and the reception is authorized for the duration of the transmission. Upon end of transmission, the lock is removed, and the receiver resumes normal scanning operations to detect new signals. In an alternative, if each receiver is associated with a receiver identification code, the associative value in the locking array may be set to the authorized receiver's identification code. This allows for affirmative testing for receive authorization during a reception, without needing to differentiate between a new or ongoing reception on a particular receiver. There are numerous equivalent locking methods known to persons of ordinary skill in the art, including methods such as ordinary arrays, traditional databases, and filesystem lockfiles.

In the architecture described above, the control system was implemented as a single software process executing on a PC, and this process was in communication with each scanning radio receiver. In some circumstances, there may be advantages to using a separate software process for control and communications functions related to each single radio receiver. For example, the communications path to each receiver may be implemented as a blocking data channel, without regard to possible impacts on maintaining communications with other receivers.

In this case, the process is essentially unchanged, except that the methods for implementing the locking functions are restricted to methods that work across multiple instances of the control software. For example, the use of filesystem lockfiles, an external database, such as MySQL, or shared memory space is preferred to a normal associative array. Another option is the use of a server, where the serial processing of requests received via a network interface can be used as a collision avoidance technology.

In the architecture described above, all coordinated radio receivers were connected to a single PC, with one or more instances of a control software process providing coordination functionality for particular receivers. In an alternative architecture, with advantages in hardware flexibility and scalability, multiple PC's are employed for this purpose, with different radio receivers from among the plurality of radio receivers connected to different PC's. This allows for the coordination of more radio receivers than may be supported by the limitations of a single PC computer, or the shared coordination of radio receivers in multiple physical locations. To coordinate radio receivers in multiple physical locations, it is also possible to interpose a network layer between a radio receiver and its associated PC computer with control software performing control functions for this radio receiver.

As will be evident to a person of ordinary skill in the art, the various functional constructions described above for a unified radio control system architecture, where there is an integrated control system governing all receivers, may be adapted to an external control structure, with free running scanners in communication with an external control system governing all receivers. For example, a trunked radio system may be monitored by allowing a group of scanners to freely scan the trunked radio system detecting new signals, and waving off receivers that detect a signal already under lease to another receiver. Other specific scenarios described previously can evidently be adapted, using similar techniques, to applications using existing scanning radio receivers that rely upon an external control system to govern their cooperative operating performance.

The present invention contemplates the use of lease time periods for the radio receivers in an illustrative embodiment of the present invention. When there is a cost associated with lock status inquiries, such as network latency when sending a query to a database or server process, it is desirable to reduce the frequency of such inquiries. For example, suppose that a group of identical radio receivers are programmed with identical scan lists. When no signals are present, any individual receiver will take a certain period of time, called here a "cycle time", to test all channels for the presence of signal.

While a signal is being received by one radio receiver, and there are no other active channels in the scan list of a second receiver, the second receiver will encounter that signal once during every sweep through its scan list, that is, at intervals of approximately the cycle time. With each detection, the control software will need to decide whether to allow reception or force the receiver to skip and resume scanning. If inquiries to the locking mechanism are inexpensive, unlikely to block or cause delays, such as happens naturally when all receivers are controlled by a single software process using an associative array, it is easy to determine whether another radio is presently receiving the signal. However, if inquiries to the locking mechanism are expensive, and likely to block or cause delays, such as happens when using a server to maintain the lock status database, it is advantageous to reduce the frequency of the repeated lock status inquiries that result from a freely running scanner repeatedly encountering the same signal during the same transmission.

An approach to this issue is to store, in conjunction with the lock information for a particular channel, an expiration time for the lock. In this case, when a lock is initially granted to a particular receiver, the lock is issued as a "lease" until a particular time, and the interval may be quite short, typically a few seconds. Then, when a status inquiry is made to the locking database, the returned lock status includes lease expiration information, typically expressed as an absolute time, or an offset from the present time. This is cached at the control system coupled to the receiver, and further status inquiries regarding that particular channel are rendered unnecessary until expiration of the lease. This reduces the frequency of these repeated status inquiries from once per cycle time to once per lease interval.

However, since other receivers will bypass or ignore content on a channel until the expiration of the lease granted to the first receiver to detect a signal, that first receiver should linger on the channel, or at least, be blocked from receiving any other content, until the expiration of its lease. Otherwise, a response in the interval between end of transmission and the end of lease could be ignored by all receivers, which is not desired.

Figure 13:
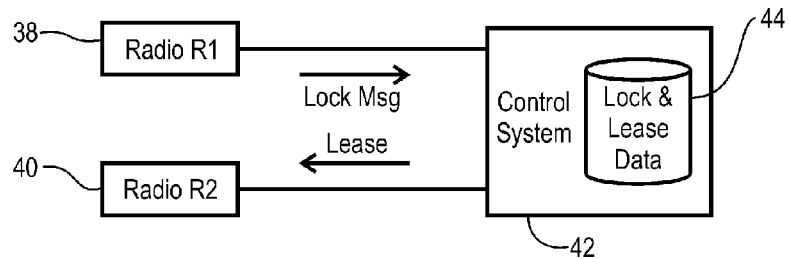
FIG. 13 is a functional block diagram of a radio and control system according to an illustrative embodiment of the present invention.
Figure 14:
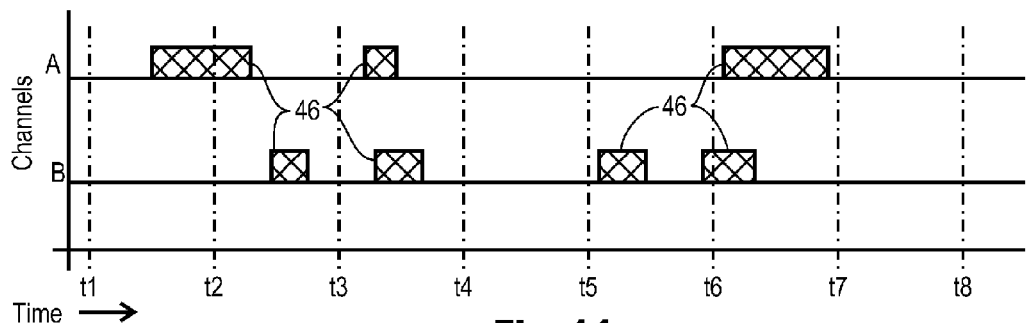
FIG. 14 is a signal transmission diagram according to an illustrative embodiment of the present invention.
Figure 15:
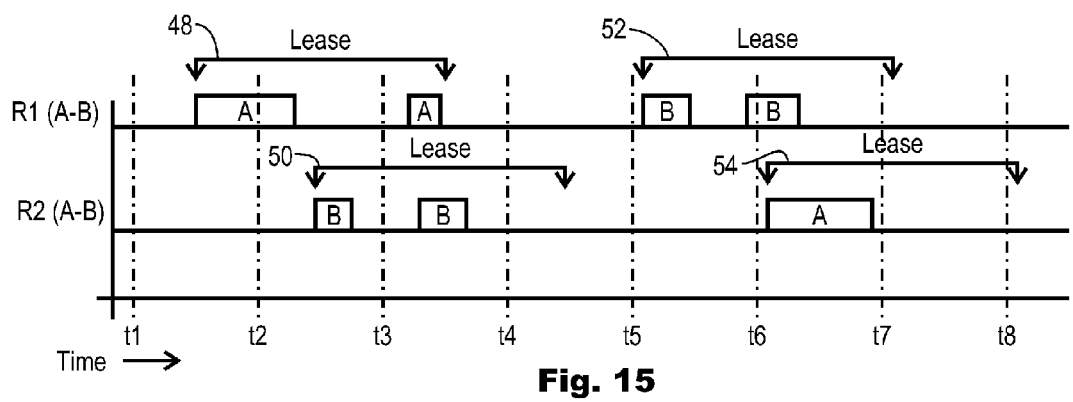
FIG. 15 is a captured signal diagram with respect to FIG. 14, and according to an illustrative embodiment of the present invention.

Reference is directed to FIG. 13, which is a functional block diagram of a system for implementing the lock request and lease function in an illustrative embodiment of the present invention. The system comprises a first radio R1 38 and a second radio R2 40. The radios are interfaced to a control system 42. The control system 42 includes a locked channel and lease database 44. As the radios detect a signal on a channel, they report the event to the control system 42, which is construed to be a lock request for reception of that signal. In response, the control system 42 issues a lease command to all the radios, and updates the lock and lease database with the lock, lease and lease duration. Reference s now directed to FIG. 14, which illustrates exemplary signal activity on two channels that are labeled A and B. Time passes through intervals labeled t1, t2, t3, t4, t5, t6, t7, and t8. Note that the signals 46 are transmission trunked and sporadic in nature. Reference is now directed to FIG. 15, which illustrates reception timing for two scanning radios, R1 and R2 that are both monitoring the signals of FIG. 14. Thus both radios R1 and R2 are enabled to scan, detect, and receive all the signals. However, as each radio detects a signal, it informs the control system 42 as a lock request for the present channel and signal, and the control system immediately issues a lease command with a predetermined duration to the radios, thereby causing the requesting radio to monitor that channel for the duration of the lease, and also causing the remaining radio to avoid that channel for the duration of the lease. In this example, the lease period is two time intervals in duration, such as from t3 to t5, etc. Thus, as the first signal in time occurs, the control system issue lease 48 to radio R1 and the signals on channel A are received by radio R1. Similarly, lease periods 50, 52, and 54 are issued for radios R2, R1, and R2 for channels B, B, and A, respectively, as is clearly presented in FIG. 15. Thus, the lease period enables controlled reception and radio resource management in the illustrative embodiment.

With regard to signal discovery and reception in an illustrative embodiment of the present invention, signals belonging to a large set of logical channels (e.g. broadcast frequencies in a conventional radio communications system, or talk groups in a trunked radio system) are detected and thereafter exclusively received by one of the receivers in the receiver array until an end time, which is usually related to the loss of signal, or end of a series of closely spaced and related communications on the same logical channel. In this context, for each signal, the operational process of the present invention may be conceptually divided into separate signal detection and signal reception phases of operation.

In most cases, it is convenient to integrate these steps through scanning receivers detecting new signals on any of a set of channels in their applicable scan or search list, and upon detection, utilizing the discovery scanning receiver already stationed on that channel to commence reception of the discovered signal. This approach avoids the time delay of tasking a second receiver to the discovered signal. However, in some instances, it is advantageous to separate the discovery and reception tasks to different receivers.

For example, in a trunked radio system, signal discovery of signal on a trunked radio talk group logical channel can be made through reception and interpretation of the datastream broadcast on a trunk system control channel. Individual transmissions on logical channels are assigned to particular working channels, a term used to refer to a broadcast frequency in the trunked radio system which may be temporarily assigned to the communications use of a particular logical channel. A trunked system control channel broadcasts a datastream reporting these temporary assignments, providing information that communications on a particular logical channel are assigned to a particular working channel. The approach of maintaining a receiver on the control channel, and dispatching other receivers to working channels as appropriate, depends on the use of a receiver capable of reporting trunk activity information while remaining tuned to the control channel; as a practical matter, this is not always possible with existing radio scanner receivers.

In this instance, signal discovery is made by a receiver tuned to a different frequency than the trunked system working channel on which the actual signal conveying content belonging to the indicated talk group will be or is currently being broadcast. At this point, either there exists a separate receiver already dedicated to that separate working channel broadcast frequency, as is the case in known detrunking methods, or a free, currently undedicated, receiver must be tasked to retune to that working channel broadcast frequency.

In either case, there is no special benefit to using the discovery receiver, since it is not already tuned to the frequency of the signal discovered, and there is an advantage to leaving the discovery receiver on the trunked system control channel frequency for the purpose of discovery of further trunked communications on other talk groups. Therefore, the overall control system may task a free and currently undedicated second receiver to tune to the discovered signal, while leaving the discovery receiver stationed on the trunked radio system control channel.

Another illustrative embodiment of the present invention contemplates the use of spectrum analysis for signal detection. Separating signal detection and reception is also possible for conventional radio communications signals. In this embodiment, a spectrum analyzer is tasked with the discovery of radio signals on a range of radio broadcast frequencies. This process can be performed by a software defined radio, with a digital automated analysis of the electromagnetic spectrum to detect active signals.

A spectrum analysis may be performed by Fourier transform of the overall ambient electromagnetic field, or by a software defined radio capable of wide-spectrum signal detection. Active signals may be recognized in a spectrum analysis by a constant and significant signal level, not showing the typical variation in intensity expected of noise or interference artifacts. The frequencies of such signals may be reported through digital means, as an output data format from the spectrum analysis software.

When a frequency is reported by the spectrum analyzer as containing active signal, the frequency is compared to selection criteria identifying frequencies of interest, such as a list of conventional broadcast frequencies of interest, which is the equivalent of a scan list, or a frequency range, which is the equivalent of search boundaries. When a signal of interest is discovered, a receiver is tuned to the discovered signal for reception of channel contents, and appropriate locking methods may be employed to register that the signal has been discovered and dedicated to a specific receiver.

In the case of a software defined radio, signal reception may be performed through the same electromagnetic field processing apparatus as the spectrum analyzer system. Such a receiver may be one of a plurality of quasi-independent software processes, threads or functions operative within the software defined radio, collectively providing the capacity for demodulating content from multiple radio broadcast frequencies in the electromagnetic environment simultaneously and in parallel. Software single-frequency receiver threads may be created and destroyed on an ad hoc basis while monitoring signals on the spectrum, based on the number of signals that are reported as currently selected for reception. Alternatively, signal reception functions may be performed by one of a set of traditional radio receiver units, working in conjunction with the spectrum analyzer signal detection system.

An illustrative embodiment of the present invention contemplates both local and remote monitoring functions. The content of a particular channel, or set of channels of interest, may be monitored from various locations. For example, when monitoring audio content received from one or more radio channels at the receive site, the audio may be monitored directly at the receivers through audio speaker elements on the receiver units. The volume of such speakers may be controlled manually, or adjusted automatically by the control system in accordance with a user selection of which particular channels are desired for elevation to the level of real time monitoring at the receive site. Channels not so selected may still be recorded for later review and delayed monitoring, or distributed to support remote monitoring locations.

The audio content may also be distributed through audio output lines, with analog voltage representation of content, where each line corresponds to the audio content of a particular channel or set of channels, irrespective of which particular receivers are currently receiving the selected sources. In this case, a switching mechanism is employed to connect an audio output line to the receiver output line of a receiver currently receiving selected content.

Multiple outputs of this type may be generated from a single receiver array, where each output is controlled through separate channel selection rules. For example, if a receiver array of four receivers is configured to receive content on 30 channels, then an array of 30 output lines may be generated, each line corresponding to the selection of a single channel. A large number of users may monitor content from the group of radio receivers used to capture audio signals, and the users may independently select channels to monitor, from among the channels captured and made available for monitoring by the group of cooperative radio receivers coupled to an audio distribution system.

Such distribution may be digital instead of analog. For example, in one implementation, audio is directed to a streaming system such as a Shoutcast server or similar streaming distribution technology, to enable remote monitoring. In this case, switching would be performed digitally, connecting a receiver audio output from a receiver currently tuned to a selected source to the input feed of the stream generation system. As with direct audio output lines, multiple streams may be generated in parallel, corresponding to different channel selection criteria. In another implementation, audio is recorded in files stored on the local PC for later analysis and monitoring. In the illustrative embodiment, audio for a single transmission is recorded and transmitted to a network file storage system, and the URL of this audio is distributed to enable remote monitoring through software configured to fetch and play audio files for each transmission on one or more selected channels.

Another illustrative embodiment of the present invention contemplates recording the audio received in the various signals. In this embodiment, for each radio receiver, a recording system captures audio output from that receiver, for storage and distribution through an access system. A typical recording system may operate on a PC computer, with radio receiver audio introduced through an audio input channel or card, and where audio processing is performed. If a radio receiver includes internal audio recording, then the recording system may be internal to the receiver element, with a digital file of an individual transmission made available for external storage and distribution.

A typical access system is a network server, where audio recording files are stored in association with descriptive information such as a channel identification code and a time of recording. Audio is then made available at a network address, made known to clients through either distributive announcement over a special network stream or dynamically generated webpages made available upon request.

Alternatively, audio obtained from a radio channel may be assembled into an audio stream, combining elements captured through different radio receivers that belong to the same logical or broadcast audio channel. Such a stream may optionally be distributed over a network, or played directly to an audio speaker connected to the local computer.

In a simpler access system, audio files representing individual transmissions on a radio channel, or all audio content on a channel over a period of time, are stored on a local file system for manual review. In this case, it may be useful to separate content on different radio channels into different folders, or files with clearly distinct filenames.

Analog acoustic audio may be conveyed via a myriad of methods using electronic signals. Regardless of their origin and intervening processing means and methods, such signals represent physical sound and are converted to the basic mode of analog acoustic audio to enable human perception.

The inventor and owner of the present invention is also an inventor or co-inventor or co-owner on a number of patents and pending patent applications for related technology. As such, the following disclosures and their entire content and teachings are hereby incorporated by reference thereto: U.S. Pat. No. 7,836,183, issued Nov. 16, 2010, to Barnett et al. for Internet Audio Scanner and Method; pending U.S. patent application Ser. No. 11/600,476 to Sullivan et al. filed on Nov. 16, 2006, for a Network Audio Directory Server and Method; pending U.S. patent application Ser. No. 11/809,964 to Sullivan et al. filed on Jun. 4, 2007, for a Network Audio Terminal and Method; and, pending U.S. patent application Ser. No. 12/432,009 to Sullivan filed on Apr. 29, 2009, for a Network Audio Distribution System and Method With regard to the receiver control software in the illustrative embodiment, each receiver is in communication with control software residing on a computer. At regular intervals, this software queries the receiver, which replies with a report on reception status, including an identification of any detected and currently received signal. This information may include the tuning frequency of the receiver, a talk group code of the signal, and/or a text tag providing a written description of the channel or its source agency. Other communications protocols may be employed, as appropriate, including models where the receiver notifies the computer software upon the detection of a signal, such as through squelch detection. In this case, the receiver may encode the channel identification information with this notification, or the control software residing on the computer may selectively query the receiver for this information upon receiving notification of a signal detection.

In an exemplary illustrative embodiment, this software operates on a computer external to the receiver. However, it is evident that these elements may be combined into a single unit, by incorporating the software functionality into the receiver's own embedded control software, or by utilizing a receiver that is integrated into the computer as an embedded component. Similarly, the receiver control software may be configured to simultaneously control multiple receivers, by wrapping the control functionality into a single executed instance. In this instance, other references to instances of software address the logical and separate operation of each receiver by this single instance of software.

Another illustrative embodiment of the present invention employs the use of a least request query. When the receiver control software receives information from a receiver identifying the channel of a signal being currently received, it sends a query called a "lease request" to the server, reporting that this particular receiver is receiving a signal on the identified channel. In the illustrative embodiment, the server managing leases is co-located on the same computer as the receiver control software. However, this server may be located elsewhere and accessible over a network by the receiver control software.

To identify the receiver in a lease request, the control software may utilize a serial number, user specified code, or other similar identifier obtained from the receiver, or utilize a similar type of identifier associated with the software instance, or generate a code based on the operating system enumeration of the data port used for communications with the receiver.

To identify the channel in a lease request, the control software may utilize the reception frequency or talk group code as reported by the receiver, a text description of the content, or other similar information that may be provided by the receiver, or obtained from the receiver. Since the same channel identification code must be used by different receivers, information used for the generation of a channel identification code should be standard and harmonized between receivers. For example, if text tags describing a channel are employed, then for a specific channel, the same text tags must be programmed into each receiver configured to detect a signal on that channel.

In some implementations, a single server, or perhaps at a server farm operating as a network service that is not co-located with the receivers, may manage independent groups of receivers for different customers or applications, where it is desired to prevent multiple receivers within a group from monitoring the same signal, but the reception of a signal on a receiver in a first group should not preclude reception of the same signal on a receiver in a second group. In effect, each group of this type should be managed separately and independently. In such an implementation, including a group identification code as part of the channel identification code will ensure that reception of a channel by a receiver in a first group will not prevent reception of the same channel by a receiver in a second group, since the server will perceive the channels as different, due to the difference in the portion of the code containing the group identity.

In the illustrative embodiment, the receiver control software maintains a cache of the server's lease database, which is itself described in following sections. Prior to contacting the server, the receiver control software consults its local cache, and determines whether a proper response can be resolved and locally executed on the basis of stored information without consulting the server. The maintenance and use of this cache is described in more detail in later sections. In one alternative, the local cache mirrors only a portion of the server's lease database, as described more fully below. In another alternative, the use of a local cache is omitted.

In another illustrative embodiment, the server receives incoming communications through a network socket, in a format compatible with the HTTP networking standard. The server formulates a response to a report from the control software, and returns this response to the control software via the content of the server's response to the HTTP network request.

It is evident that non-HTTP network protocols may also be employed, or protocols related to HTTP that do not strictly follow the standard (e.g. using requests in the GET format that result in a change of state on the server, such as modifications to its association table).

If the server and receiver control software are co-located on the same computer, or these are on devices using the same file sharing system, the functions of the server element may be performed by software that is not a true server, and substitutes interprocess communication through files for interprocess communication through sockets.

Another illustrative embodiment of the present invention contemplates the sue of a lease database. In this embodiment, the server maintains a database associating channel identification codes with receiver identification codes. In normal circumstances, both sets of codes would have unique values (i.e. a database would contain only a single instance of each channel identification code value, and only a single instance of each receiver identification code value). In addition, the database would ordinarily be quite small, with under 100, and often under 10, entries. If repeat field values are not anticipated, and the database is small, there is a high degree of operational flexibility in choosing a database structure.

In some implementations, for each association between channel and receiver codes, the database also includes a lease expiration time saying when this particular association expires and is no longer valid. In this context, the association between channel and receiver can be interpreted as a lease granted by the server, wherein exclusive authority to receive a channel is granted to a specific receiver until the specified lease expiration time. Expired entries may be explicitly removed, ignored, or overwritten, for instance, when a new entry is placed into an associative array with the same key.

In the illustrative embodiment, the database is implemented as an associative array using the channel identification codes as keys, and wherein the associated values are two element arrays including a receiver identification code and lease expiration time. In this database format, it is simple to ascertain whether a currently valid lease exists for a specific channel, and if so, which receiver holds the lease.

Numerous alternative database formats and implementations will be evident to a person of ordinary skill in the art. Such methods may include a Structured Query Language (SQL) database, an associative array keyed on receiver codes, an array of arrays with numerically indexed subfields for receiver and channel codes, an array of strings including receiver and channel codes, an external file written in a standard format such as text/CSV, or etc.

An illustrative embodiment of the present invention employs the use of a least test. When the server receives a report from the control software indicating that a particular identified receiver is receiving a particular identified channel, the server consults the database to see if there is a currently valid, and unexpired, association between this channel and any receiver. The server's actions from that point depend upon the result of this "lease test".

If the lease test is negative, then it is known that no receiver has been assigned the responsibility to monitor the channel of this transmission, and such a lease shall be granted to the receiver that has detected the signal. The server creates a new entry in the database associating the indicated channel with the indicated receiver, and provides the control software for that receiver with a positive response.

Since the server's socket management places incoming network transactions into a sequential order for processing, this process automatically resolves collisions where multiple receivers detect the same signal at the same time, for instance, at the start of a new transmission. The report placed earlier in the socket connection queue will have priority, and that receiver will obtain the lease for the channel. Then the server will process reports from other receivers, and at that time, the first receiver will already have a valid lease, and other receivers will therefore be waved off from the signal.

In an illustrative embodiment, when a new lease is issued, the server calculates a lease expiration time by adding a predetermined lease duration to the present time, and writes this value into the new database record associating this channel with this receiver. In an alternative embodiment, the receiver control software may propose a lease duration or lease expiration time to the server, as supplementary information to the report of the channel and receiver identification codes. In this case, the server may validate that the requested lease duration falls within administratively authorized limits, and make adjustments to that duration as needed to ensure that granted lease durations are acceptable.

If the selected configuration uses a requested lease duration, then the receiver control software's user interface can provide a field for user control of this value. This is particularly beneficial if the receiver has a settable "linger period" controlling how long it remains on a channel after the end of transmission. As discussed below, it is beneficial to have the lease duration approximately match the receiver's linger period.

In another alternative, the choice of a lease duration, or proposed lease duration, may be contingent on the particular channel or class of channel being received. For instance, values of defaults or limits may be different for conventional and trunked systems, or values may be automatically determined on the basis of statistical analysis of transmission durations on this or similar channels. Similarly, values may be automatically determined on the basis of statistical analysis of all signals received by the receiver or set of receivers, irrespective of the identity of the particular channel presently reported.

In another illustrative embodiment, the use of a lease extension is contemplated. If the lease test is positive, and the existing lease was previously granted to the same receiver, then it is known that this receiver has exclusive rights and responsibilities for monitoring this transmission. The server provides a positive response to the control software for that receiver. If the database record includes a lease expiration time, the server also determines a lease extension duration, and updates this database field with the new value. This step is done before the positive report is sent to the control software, so that the software can be informed of the new expiration time. The duration of a lease extension is determined in a manner generally analogous to the duration of a new lease, but a user or administrator may be given the option to apply different defaults, constants and limits for the duration of new leases and lease extensions.

If the lease test is positive, and the existing valid lease for this channel is held by a different receiver, then the server provides the control software with a negative response, and the control software then commands the receiver to not receive that signal. It is preferred that the command to the receiver cause it to resume scanning operations, so that it will be capable of detecting and receiving other signals that may be simultaneously present.

In some implementations, it is acceptable to simply disregard the received signal on that receiver until the end of transmission. That variant precludes the benefit of freeing the receiver to detect other signals, and therefore loses much of the advantage of the present invention, but still prevents the parallel acquisition and use of the same signal from multiple receivers.

In the illustrative embodiment, the command issued to the receiver is a "skip" command, which causes the receiver to cease monitoring the signal on its present tuning and resume the scanning process for detecting signals, but does not inhibit the scanner from subsequent rediscovery of the same signal in the course of its normal scanning process. In an alternative embodiment, the receiver may be issued either a "lock out" or "delete channel" command, causing the receiver to cease monitoring the signal on its present tuning and resume the scanning process for detecting signals, and also inhibiting the scanner from subsequent rediscovery of signals on the same broadcast channel (e.g. conventional frequency or logical talk group) in the course of its normal scanning process.

In the illustrative embodiment, the server's positive or negative response to the receiver control software is provided in the content of a response to an HTTP request from that software reporting the channel and receiver identification codes. Various ways to encode this response will be evident to a person of ordinary skill in the art. A simple method is a yes/no reply, which can be presented in a single character. It is evident that other network protocols and architectures may be employed. For example, if the receiver control software is responsive to network traffic on an incoming socket, then the server may provide the response as a separate network transaction addressed to the receiver control software. Such a transaction may also be implemented as UDP packets in each direction, instead of standard TCP/HTTP communications.

When the server maintains a lease database that includes lease expiration times, as in the illustrative embodiment, a more sophisticated method than a yes/no response is for the server to provide the receiver control software with a copy of all or a portion of the lease database, following any alterations made in response to the control software's query (e.g. issuing or extending a lease to that receiver). This copy may be rendered in a textual format for ease in HTTP transport, for instance with fields separated with commas, or aligned into fields by column position. The receiver control software maintains a cache of known entries in the server's lease database, and prior to contacting the server upon detection of a new signal, the receiver control software consults its local copy of the cached database and determines whether a lease test on the basis of that information would reveal a receiver that is exclusively authorized to receive this signal, taking into account the current time and the relevant cached lease expiration time.

Another illustrative embodiment of the present invention contemplates the use of a database cache. In this illustrative embodiment, with every response from the server to receiver control software, the server provides a complete copy of all valid entries in the lease database. In an alternative embodiment, the server provides only a subset of the lease database in this response. The subset may be restricted to a set of channels known to be in this particular receiver's scan list or range of reception, where the range is usually a reference to the receiver's limitations in frequency, system or geography, or the subset may be limited to the single channel currently detected by this receiver. When receiving a subset of the database, the receiver control software may either replace or merge the new information with its existing cache. In any case, the receiver control software must utilize its cache under the presumption that there may exist records in the complete database, as held by the server, that are absent from the cache, since leases may have been issued or extended by the server in the interval between the most recent cache refresh and cache utilization. However, an exception is possible if the receiver control software can be addressed over the network. In this case, in an alternative implementation, each time the server makes a change to the lease database, the server transmits all or a relevant portion of that database to the control software for all receivers capable of receiving the signal referenced in the new or modified record, or possibly to all receivers irrespective of their capacity.

It is generally useful for the server provide a full copy of the cache. For receivers that are not under lease to a particular channel, this leads to a significant enhancement in effective scanning speed, since the receiver control software can locally determine that a particular signal should not be received, based on a valid cached entry showing the channel under lease to another receiver, without the delay of a network transaction with the server. However, if the full copy of the cache is extremely large, then the delivery and maintenance may be burdensome, and a subset may be more efficient. This is especially true for receivers not capable of receiving all channels referenced in the full cache, and it may be more efficient for the server to omit the listing of entries that cannot be relevant to a particular receiver. If this is done, the server needs to consult information indicating the range of channels that can and cannot be received at that receiver. Such information may come from a supplementary database at the server, and/or from information supplied by the receiver control software in its report, for instance, a geographic or frequency range restricting its operational scope.

When the receiver control software consults a local cache, if a valid record for the relevant channel identification code is not present, then the software continues with the normal process of contacting the server to report the channel and receiver identification codes. Even if the local cache is known to be complete and fully updated, preventing other receivers from detecting the same signal requires an update at the server's cache that depends upon the transmission of this information to the server. However, if the local cache includes a valid record referencing this channel identification code, then the receiver control software may be able to handle the event locally without consulting the server. For example, if this record shows that another receiver has a valid lease on this channel, then the receiver control software directly initiates the appropriate steps for preventing reception of this signal at the receiver, such as transmitting a skip or lock out command to the receiver. If the record shows that this receiver already has a valid lease on this channel, then the reception is known to be authorized and is permitted.

An illustrative embodiment of the present invention contemplates a triggering function for lease renewals. If the local cache shows that a receiver holds a valid lease on a channel, it may still be advantageous to report the receiver and channel identification codes to the server, for the purpose of extending the lease. If the lease expires while the receiver is locked to an active signal, then there is no system constraint against other receivers acquiring the signal and being issued valid leases for simultaneous reception of the same channel alongside the present receiver. The receiver control software can obtain a new lease upon lease expiration, but any time window between expiration and reissuance opens the possibility of another receiver capturing a valid lease for this channel, which is viable but undesirable because the shift may introduce artifacts or lack of contiguity in the reception of the signal. For this reason, it is useful for that lease renewal be implemented prior to lease expiration. However, it is undesirable for the receiver control software to hammer the server with continuous reception reports during signal reception, so reports of an ongoing reception should not be automatically submitted at all times, but instead be limited in a manner that efficiently allows for lease renewal where appropriate.

In the illustrative embodiment, the receiver control software is inhibited from issuing reports to the server for a channel where the receiver holds a valid lease, until the time remaining until lease expiration falls below a threshold. Such a threshold may be defined as a literal duration until lease expiration, or a fraction of the total original duration of the lease. At that time, the receiver control software sends the server a report including the channel and receiver identification codes, the server extends the lease, and reports the new expiration time to the receiver control software. This process limits the network exchanges between the receiver control software and the server to an acceptably low data rate.

With regard to the duration of a lease, when choosing the durations for leases and lease renewals, there are several factors to consider. For the most part, the same considerations apply to both duration settings, and it is expected that the values will be similar. However, if signals are expected to have a certain minimum duration, the optimal initial lease may be somewhat longer than a lease renewal.

As the lease duration becomes shorter, instances of receiver control software will more frequently report active signals to the server, which can burden the server or the network. In addition, this can lower the effective scanning rate of receivers, since it is faster for receiver control software to locally determine that a receiver should not receive a signal. A shorter lease duration also shortens the interval between the granting and renewal of a lease, and if this interval becomes too short, then an active receiver may burden the server with a series of lease renewal requests throughout the duration of an active signal. When considering minimum lease durations, network latency should be taken into account, especially if the server is not co-located with the receiver control software.

As the lease duration becomes longer, a fixed number of receivers will successfully monitor a smaller fraction of the available signals, due to increased dead time when a receiver holds a lease to a particular channel that is inactive or not transmitting content. For example, if a signal is only present for ten seconds, but a lease is granted for sixty seconds, then that receiver will be inhibited from monitoring any active signal for fifty seconds between the end of transmission and the lease expiration. This may not be significant to some users when there exist free receivers not under lease and available to capture a new signal, although average time to signal detection may degrade, since there are fewer free receivers scanning for new signals. But if all receivers are under lease, including receivers under lease to channels presently inactive, then a new signal on another channel will pass undetected, at least until the lease expires on one of these receivers. This can result in missed transmissions, even when there exist receivers not receiving any active signal at that time.

In the illustrative embodiment, the lease duration is set long enough to avoid any excessive loads on the server, but not extended significantly further to avoid underutilization of the receivers. For example, in a network of four receivers, a lease duration of three to five seconds has been satisfactory in actual practice.

Another illustrative embodiment of the present invention contemplates effective clock synchronization within the inventive system. The leasing process depends upon precision timing to coordinate knowledge of lease status among the server and multiple receivers. If an instance of receiver control software believes that an active lease is still in effect, beyond the actual moment when the server believes that the same lease expires, then there exists the possibility of two receivers simultaneously monitoring the same signal. This would happen because a second receiver could request and obtain a lease from the server during that time interval, while simultaneously the first receiver, detecting the same signal at the same instant, also monitors the signal without contacting the server, since it is under the impression that it holds an existing active lease on that channel. It is better for receiver control software to err on the side of believing that a lease expires slightly before the moment when the server has the same impression. In this case, if the receiver rediscovers the signal during the time window between these two moments, it will report the receiver and channel combination to the server, an action that triggers a lease extension from the server. There does remain, however, a possibility that the receiver may discover a different channel during this time window. The server should protect against this case by rejecting lease requests from a receiver believed to hold an active lease on a channel different from the one reported in a lease request.

In the illustrative embodiment, all devices operating software, the server or the receiver control software, maintain accurate clocks, synchronized to a standard clock with Network Time Protocol (NTP). Note that time information is only sent from the server to receiver control software; no literal clock times are sent in the reverse direction, only requested lease durations, in some implementations.

In an alternative embodiment, as a protection against unsynchronized clocks, the server reports the remaining duration of leases in any transactions with receiver control software, in lieu of, or in addition to, reporting the actual lease expiration time as reflected in the server's copy of the lease database. Then the receiver control software adds the reported duration to its own current clock time, and utilizes this regenerated lease expiration time for its own operations. This synchronizes knowledge of the moment of actual lease expiration in the real world, even if some device clocks are not correctly synchronized. However due to network latency, without further compensation, the receiver control software will believe that a lease ends slightly after the server has the same impression, by the interval between transmission and receipt of the server's message. This is not desired, so an offset may be applied in compensation, either based on measured latency or using a constant selected to provide a safe buffer. In an alternative, an automatic selection is made between utilizing an absolute clock or remaining duration offset, based on whether there appears to be a mismatch between the two device clocks.

In another illustrative embodiment, the server and all receiver control software instances are executed on the same computer device. This minimizes network latency and eliminates clock variation. However, it is evident that the software elements may be executed on different computing devices. The server element may be located at a central server providing similar services to multiple unrelated customers, although network latency may become an issue.

Another illustrative embodiment of the present invention contemplates a system that operates without a lease expiration time. If the lease database does not include lease expiration times, the receivers are responsible for deciding when to release their own lease on a channel, and informing the server at that time. Upon receipt of such a message, the server erases the lease association for that receiver, or marks it as invalid.

The cache at the receiver control software is limited to a single entry, for the channel identification code of an active lease held by that receiver. When the server reports leases to a receiver control software, a simple yes/no response regarding the granting of a lease to a specific channel is sufficient.

The receiver control software cannot utilize the entire lease database, even if supplied, because there is no assurance any entry will still be valid at a time in the future, so a recheck with the server would be needed in any case at a time when the cache would be consulted.

Lease duration is not determined by the server, there is no concept of lease renewal, since leases do not naturally expire, and it is preferred that the eventual duration of a lease is not determined at the start of a lease. Instead, the receiver control software terminates a lease when signal has been absent for a certain duration on a channel. This timeout interval may be set at the server, and provided to receiver control software during initialization or in response to lease requests, or the timeout may be set within the receiver control software.

Another illustrative embodiment of the present invention implements a hold mode of operation. In this embodiment, while a receiver has a lease on a particular channel, the receiver control software commands the receiver to hold on the specific frequency or talk group corresponding to that channel. The hold state inhibits scanning, and since the receiver then remains continuously observant for activity on this channel even during periods of carrier inactivity or silence, this has the advantage of faster detection of new transmissions on the leased channel when there are multiple discrete transmissions within the lease interval. The receiver control software commands the release of the hold state upon the expiration of the lease.

This is desirable when the receiver control interface allows for prompt and unambiguous holding on a specific frequency or talk group. However, many commercially available receivers require a long command string for commanding to a specific frequency or talk group, and the operation would interfere with the active reception, possibly causing a noticeable delay in the acquisition of new signals. Some receivers offer a simple hold command, to hold on the currently tuned frequency or talk group. However, there is some chance of a mismatch between the receiver's current tuning and the desired tuning for reception of the leased channel. For example, if there is a brief unsquelching on a frequency, the receiver may resume scanning before the receiver control software has an opportunity to execute a hold command, resulting in the receiver holding on a channel for which it does not have a lease, and being insensitive to new transmissions on the channel for which is has a lease. To avoid holding on the wrong channel, the receiver control software can be configured to inquire what channel the receiver is actually holding on, but the additional complexity may not be worthwhile.

These difficulties with the use of hold are overcome if the receiver has a feature for lingering on a specific frequency or talk group for a duration after the end of a transmission. In this case, if the receiver control software receives a report of an active signal detection, it is ensured that a 'hold' command transmitted to the receiver within the duration of the receiver's linger feature will result in the receiver holding on the intended channel.

Even if hold is not used, such a linger feature is beneficial, because, during the linger, the receiver will not be scanning, and will not be delayed through a scan cycle before detecting a follow-up transmission. Ideally, the linger state would continue until the moment when the lease expires, because the receiver is not allowed to monitor any other signals until that time. However, for receiver models with a settable linger time, it is not possible to have this matching occur automatically in configurations using a lease expiration time. This is possible when the lease database does not include a lease expiration time, since the receiver control software can then release the lease at the moment when the scanner's linger state terminates. However, if the linger period is too long, there is a greater chance of missed transmissions due to the receiver being unavailable for scanning for new signals. This issue is the same as a lease period that is too long; linger affects the receiver's actual tuning and ability to detect signals on other channels, while lease affects the receiver control software's willingness to monitor signals on other channels.

In another illustrative embodiment of the present invention, a lock out function is contemplated. In this embodiment, when receiver control software becomes aware that another receiver has a lease on a channel within the scan list of the receiver under its own control, then the receiver control software commands that receiver to 'lock out' the channel. This inhibits detection of a signal for which this receiver has no chance of being allowed to monitor. Locking out a frequency in this manner makes the scanning process somewhat faster, and preventing the receiver from sampling and reporting unwanted signals, and being forced off through a skip command, also makes the scanning process faster. However, as with the hold feature described above, the receiver control interface for many currently available commercial receivers does not allow for prompt and unambiguous control of the receiver in this manner, creating a risk of introducing delays in receiver operation, or locking out unintended channels. In addition, a design using lock out must clear lock outs as the leases on those channels expire, and it should be noted that this is not simultaneous and global, so releasing all lockouts at once is not an optimal solution.

In regard to the construction of scan lists in a typical application, an illustrative embodiment provides that all receivers are programmed with identical scan lists, and all receivers are capable of receiving the same channels. However, in some circumstances, one receiver may be physically capable of receiving a channel that cannot be monitored with another receiver. For example, some receivers of a more sophisticated design may be capable of monitoring trunked radio systems that are not accessible with another model in use. Similarly, one receiver model may have a wider tuning frequency range than another model. Receivers may be physically located in different places, or use different antennas, with these differences affecting the set of channels that may be monitored with a particular receiver, or making it such that reception quality is better on one receiver than another. For these reasons and others, it may be beneficial to vary the scan lists between receivers.

Even when receivers have identical reception characteristics, there are circumstances where it is advantageous to administratively set different scan lists between the receivers, especially when there is a difference in priority between different signals monitored by the collective receiver network.

At the limit, a single receiver may be dedicated to a single priority frequency or talk group to ensure detection of all activity, and the channel is then omitted from the scan list of all other receivers since coverage is known to be complete. However, it is not necessary to connect such a receiver to the receiver control software, as the tuning is always fixed; the receiver audio output can supplement the other receivers without active tuning control.

In a more practical application, a receiver may be programmed with an unusually short scan list, but greater than one entry, of priority frequencies or talk groups. This has two advantages.

First, the cycle time will be unusually short, ensuring frequent sampling for activity on these priority channels when the receiver is not under lease to a particular channel, and hence more rapid detection of new transmissions on these priority channels. The phenomenon is evident, for example, in a two-receiver network, where one receiver has a scan list of three priority channels, and the other has a scan list of 100 channels, and possibly including the priority channels. When there is no active lease at either receiver, a new signal on a priority channel will usually be detected more rapidly, with a maximum three scan steps, than a new signal on another channel, with a maximum 100 scan steps.

Second, divergent scan lists can eliminate the possibility of the entire receiver network being captured by activity on lower-priority channels. For example, in the two receiver network described above, even if multiple low priority channels are active, the first receiver will remain free for detecting traffic on a high priority channel. Conversely, if both receivers had identical 100-channel scan lists, both could be captured by traffic on low priority channels, leaving none free for traffic at that time on a priority channel.

Due to these effects, it is often beneficial to have some receivers scanning a long list of low priority channels, while other receivers are devoted to a shorter list of high priority channels. It may be unclear whether high priority channels should be included in the longer scan list. This provides a better chance of reception in case all high priority receivers are captured by traffic on high priority channels. However, if high priority traffic happens to be detected first by a receiver with a long scan list, as is statistically likely to happen on occasion even if a high priority receiver is free, the longer cycle time may create slower detections of follow-up transmissions during the lease interval. This is because the receiver does not hold on the channel throughout the lease period, and may resume scanning before the lease period is expired, only to have the receiver control software force the receiver to skip away from any other detected signals. This effect is mitigated to some extent if the receiver is configured to linger on a channel for a period after the end of transmission, since it is more likely that the receiver will still be tuned correctly when the follow-up transmission begins.

Another illustrative embodiment of the present invention contemplates a dynamic reprogramming function in the system. In this embodiment, the receiver control software dynamically reprograms a receiver's scan list, in accordance with lease status. The viability of dynamic reprogramming depends upon the data control interface of the receiver, and may be impractical on many commercially available receivers due to the inactive time required to submit long programming commands through an external data interface. But if a receiver supplies a programming interface that allows for fast reprogramming, the use of a dynamic reprogramming process can provide improved performance.

The server maintains a list of all channels to be monitored by the receiver constellation, periodically updates a scan list for each receiver, and upon changes to a particular receiver's intended scan list, commands the reprogramming of that receiver through the receiver control software. Such programming changes may be implemented as insertion or deletion of channels, or the use of lock out to temporarily suppress channels, or the use of quick keys, for reference, see the operation of the exemplary scanning receiver, to temporarily select or deselect channels or groups of channels.

Under most circumstances, all channels to be monitored will appear on at least one of the scan lists. However, on occasion channels may be dropped from active monitoring, for example when all receivers are under lease and actively monitoring for signals on specific channels. Similarly, low priority channels may be dropped from all scan lists when their inclusion would lower the speed or probability of response to other channels to a degree that is undesirable.

When the server grants a lease request, the scan list for that receiver is reduced to the single channel to be monitored during the lease interval. If that receiver's scan list previously included channels not being scanned elsewhere, these channels are redistributed into the scan lists for other receivers, which are also updated through reprogramming. In this manner, the scan lists are rebalanced.

An advantage of including each channel in only one active scan list is that the scan list for any single receiver is typically fairly short, reducing the variance in the speed of detection of new signals. If a channel is present in several long scan lists, it may be detected quickly by any receiver, but it may also be detected slowly if all receivers scanned past this channel just before the start of transmission. This technique keeps scan lists short, minimizing the maximum duration until detection of a new signal.

In this context, higher priority channels may be placed in receiver scan lists that are shorter than average, so that signals on the higher priority channels are detected more quickly than signals on other channels. In this variation, the server generates scan lists of different lengths, and priority channels are preferentially placed into the shortest generated scan lists.

Another illustrative embodiment of the present invention contemplates the management of data content. In some cases, the content of a radio signal, or other signal source, may be information or data other than audio content. The data conveyance methods described herein, for detecting and sampling intermittent content from a variety of sources through a smaller number of receivers capable of receiving this content, are similarly applicable to a wide variety of data formats, presuming the monitoring system is capable of processing and presenting information of the data type carried on the channels being monitored.

Another illustrative embodiment of the present invention contemplates the implementation of voice detection, for "VOX" audio detection. In the case of a radio receiver, the squelch test provides a real time indication of the presence of signal. The start and end of each audio transmission may be presumed to coincide with the start and end of carrier signal on the radio frequency carrying this content. Another way to determine the start and end of audio content is through a VOX detector, monitoring the audio levels on an audio input line. In this case, the start of a transmission is indicated when audio becomes present on a previously quiescent input line, and the end of a transmission is indicated when the audio level falls to a low level for a meaningful interval. For example, this may be determined through a moving average of the audio level with a decay time appropriate to the application, or through the termination of background noise indicative of a live microphone feeding the line, or through a timer registering the absence of significant audio for an interval.

The VOX detection method is particularly useful for processing audio from a microphone source that has not passed through a radio transmission system. It is also useful in some radio receiver applications, especially if squelch information is unavailable or cannot be delivered to the control system processing the receiver audio output. For example, this is particularly useful with simpler radio receivers that are not frequency agile, a configuration useful when dedicating a receiver to each working channel of a trunked radio system.

Another illustrative embodiment of the present invention contemplates the use of a multiplexer for audio sources. An analogy to scanning radio frequencies for the presence of signal is found in scanning audio inputs through a multiplexer for the presence of active audio content. In this case, each receiver is coupled to at least one data or audio input line fed by a multiplexer, with a larger number of sources available and individually selectable through the multiplexer when an appropriate control signal is applied. The control signal to the multiplexer may step through sources, or dynamically select an arbitrary source by an identification code.

With a multiplexer, the receiver or control system sequentially steps through sources of interest by sending appropriate selection commands to the multiplexer. In each position, the receiver tests for the presence of signal, usually through application of a VOX method to detect current audio content on the selected source.

Accordingly, the reader will see that the present invention enables a larger plurality of sources to be monitored for intermittent content through a smaller number of receivers capable of receiving content from these sources, with a high degree of efficiency in receiver utilization. Further, this technique is simple and efficient, and is functional without consideration of the relative level of activity from specific sources, or foreknowledge about which sources will be active at a given time. These features are especially useful for distribution over a network, enabling remote monitoring by a large number of users without conflict in receiver control for the selection of particular sources made available for monitoring through the limited number of available receivers.

While the above description includes many specificities, these should not be construed as limitations on the scope of the invention, but rather as an exemplification of one illustrative embodiment thereof. The variants presented in the alternative embodiments, as well as the elements mentioned in the dependent claims, may be combined in various combinations obvious to a person with ordinary skill in the art, in light of the concepts described and suggested herein, and such variants are intended to fall within the scope of the present invention. Many other variations are also possible. Accordingly, the scope of the invention should be determined not by the embodiments illustrated, but by the appended claims and their legal equivalents.

Thus, the present invention has been described herein with reference to a particular embodiment for a particular application. Those having ordinary skill in the art and access to the present teachings will recognize additional modifications, applications and embodiments within the scope thereof.

It is therefore intended by the appended claims to cover any and all such applications, modifications and embodiments within the scope of the present invention.

What is claimed is:

1. A method of simultaneously receiving plural signals from plural source channels using plural receivers that are coupled to a control system having a database for locking records linking individual receivers to individual source channels, which have identification codes, the method comprising the steps of:

sequentially sampling a list of source channels for signals by a first receiver, and upon detecting a current signal on a first source channel, receiving said current signal and reporting a corresponding first channel identification code to the control system;

upon receipt of said first channel identification code by the control system, searching the database for a locking record containing said first channel identification code;

upon finding a locking record containing said first channel identification code linked to a different receiver in the database, communicating a cease reception command to said first receiver, thereby causing said first receiver cease receiving said current signal;

upon determining that a locking record containing said first channel identification code is not stored in the database, storing a new locking record in the database linking said first receiver to said first channel identification code, thereby enabling said first receiver to continue receiving for at least the duration of said current signal.

2. The method of claim 1, further comprising the steps of:
specifying a source channel of interest from amongst the plural source channels;
selectively monitoring discrete signals from said source of interest as received by any of the plural receivers;
capturing said discrete signals from said source channel of interest.

3. The method of claim 1, wherein a portion of the source channels are radio channels, and a portion of the receivers are frequency agile radio receivers, and further comprising the steps of:
affecting the source channel selection of a first frequency agile radio receiver, and
affecting the radio tuning of the first frequency agile receiver.

4. The method of claim 1, further comprising the steps of:
recording said current signal.

5. The method of claim 1, further comprising the steps of:
storing said current signal received from said first source channel at a network accessible address;
communicating into the network, a notification of said network accessible address together with said first channel identification code.

6. The method of claim 1, further comprising the steps of:
generating an audio stream recorded from a sequence of signals output from said first source channel, as received from the plural receivers from time to time;
distributing said audio stream of content through a network to a remote monitoring location.

7. The method of claim 1, and wherein said cease reception command further comprises the step of:
sending a skip command, which causes said first receiver to stop receiving said current signal to return to said sequential sampling step.

8. The method of claim 1, and wherein said cease reception command further comprises the step of:
instructing said first receiver to remove said first source channel from said list of source channels being sequentially sampled, and return to said sequentially sampling step.

9. The method of claim 1, and wherein the database further includes for access locks linked to the locking records, and wherein:

said storing a new locking record step further includes the step of storing a first access lock linked to said new locking record, and wherein when said current signal ceases, the control system responds by removing said first access lock from the database.

\* \* \* \* \*